(12) United States Patent
Freund et al.

(10) Patent No.: US 10,763,102 B2
(45) Date of Patent: Sep. 1, 2020

(54) TRANSFERABLE SILICA BILAYER FILM

(71) Applicant: Fritz-Haber-Institut der Max-Planck-Gesellschaft, Berlin (DE)

(72) Inventors: Hans-Joachim Freund, Berlin (DE); Markus Heyde, Berlin (DE); Christin Büchner, Berlin (DE)

(73) Assignee: FRITZ-HABER-INSTITUT DER MAX-PLANCK-GESELLSCHAFT, Berlin (DE)

( * ) Notice: Subject to any disclaimer, the term of this patent is extended or adjusted under 35 U.S.C. 154(b) by 0 days.

(21) Appl. No.: 16/083,338

(22) PCT Filed: Mar. 6, 2017

(86) PCT No.: PCT/EP2017/055164
§ 371 (c)(1),
(2) Date: Sep. 7, 2018

(87) PCT Pub. No.: WO2017/153321
PCT Pub. Date: Sep. 14, 2017

(65) Prior Publication Data
US 2019/0103269 A1    Apr. 4, 2019

(30) Foreign Application Priority Data
Mar. 7, 2016 (EP) ................................. 16158906

(51) Int. Cl.
*H01L 21/02* (2006.01)
*C23C 14/10* (2006.01)
(Continued)

(52) U.S. Cl.
CPC .... *H01L 21/02164* (2013.01); *C23C 14/0005* (2013.01); *C23C 14/10* (2013.01);
(Continued)

(58) Field of Classification Search
CPC ......... H01L 21/02164; H01L 21/02203; H01L 21/02266; H01L 21/2007; H01L 21/28167;
(Continued)

(56) References Cited

U.S. PATENT DOCUMENTS 3,560,810 A * 2/1971 Balk ..................... H01L 21/316
                                                        257/406
5,098,865 A * 3/1992 Machado .......... H01L 21/02164
                                                        148/DIG. 118
(Continued)

OTHER PUBLICATIONS

Büchner et al., "Adsorption of Au and Pd on Ruthenium-Supported Bilayer Silica," *The Journal of Physical Chemistry*, 118: 20959-20969, (2014).
(Continued)

*Primary Examiner* — Feifei Yeung Lopez
(74) *Attorney, Agent, or Firm* — Seed IP Law Group LLP

(57) ABSTRACT

The present invention inter alia relates to a supported silica bilayer ($SiO_2$ bilayer) film. In the supported silica bilayer film, the silica bilayer film consists of two atomic layers of corner-sharing $SiO_4$ tetrahedra, forms in itself a chemically saturated structure and contains pores. The silica bilayer film has a first (1) and a second side (2) and is supported on the first side (1) by a removable polymer film. The invention further relates to a process for producing the supported silica bilayer film, a process for transferring a silica bilayer film, a free-standing silica bilayer film, a stack comprising a plurality of silica bilayer films, a filed-effect transistor having a gate oxide comprising the silica bilayer film or a stack thereof and the use of a silica bilayer film.

13 Claims, 4 Drawing Sheets

(51) Int. Cl.
  H01L 21/28   (2006.01)
  H01L 21/20   (2006.01)
  H01L 29/51   (2006.01)
  C23C 14/00   (2006.01)
  H01L 29/78   (2006.01)

(52) U.S. Cl.
  CPC .. *H01L 21/02203* (2013.01); *H01L 21/02266* (2013.01); *H01L 21/2007* (2013.01); *H01L 21/28167* (2013.01); *H01L 29/51* (2013.01); *H01L 29/517* (2013.01); *H01L 29/78* (2013.01)

(58) Field of Classification Search
  CPC ..... H01L 29/51; H01L 29/78; C23C 14/0005; C23C 14/10
  See application file for complete search history.

(56) References Cited

U.S. PATENT DOCUMENTS

| | | | |
|---|---|---|---|
| 8,377,243 B2 | 2/2013 | Gölzhäuser et al. | |
| 2011/0104502 A1* | 5/2011 | Calixto Martinez | ... C03C 17/30 428/429 |
| 2013/0248097 A1 | 9/2013 | Ploss, Jr. | |
| 2014/0367257 A1* | 12/2014 | Nogami | ................ B01L 3/5023 204/403.06 |
| 2015/0253511 A1* | 9/2015 | Pelley | ................. G02B 6/3584 385/14 |

OTHER PUBLICATIONS

Emmez et al., "Permeation of a Single-Layer $SiO_2$ Membrane and Chemistry in Confined Space," *The Journal of Physical Chemistry*, 118: 29034-29042, (2014).

Huang et al., "Direct Imagine of a Two-Dimensional Silica Glass on Graphene," *Nano Lett.*, 12: 1081-1086, (2012).

Osada et al., "Two-Dimensional Dielectric Nanosheets: Novel Nanoelectronics From Nanocrystal Building Blocks," *Adv. Mater.*, 24: 210-228, (2012).

Shaikhutdinov et al., "Ultra-thin silica films on metals: The long and winding road to understanding the atomic structure," *Adv. Mater.*, 25(1): 49-67, (Jan. 4, 2013).

Alexandre et al., "Polymer-layered silicate nanocomposites: preparation, properties and uses of a new class of materials," *Materials Science and Engineering* 28:1-63, 2000.

Altman et al., "Growth and Characterization of Crystalline Silica Films on Pd(100)," *J. Phys. Chem. C* 117:26144-26155, 2013.

Bae et al., "Roll-to-roll production of 30-inch graphene films for transparent electrodes," *Nature Nanotechnology* 5:574-578, 2010.

Barin et al., "Optimized graphene transfer: Influence of polymethylmethacrylate (PMMA) layer concentration and baking time on graphene final performance," *Carbon* 84:82-90, 2015.

Björkman et al., "Defects in bilayer silica and graphene: common trends in diverse hexagonal two-dimensional systems," *Scientific Reports* 3:3482, 2013. (7 pages).

Butler et al., "Progress, Challenges, and Opportunities in Two-Dimensional Materials Beyond Graphene," *ACSNano* 7(4):2898-2926, 2013.

Cappella et al., "Breaking polymer chains by dynamic plowing lithography," *Polymer* 43:4461-4466, 2002.

Cheng et al., "High-frequency self-aligned graphene transistors with transferred gate stacks," *PNAS* 109(29):11588-11592, 2012.

Ferrari et al., "Science and technology roadmap for graphene, related two-dimensional crystals, and hybrid systems," *Nanoscale* 7:4598-4810, 2015. (214 pages).

Geim, "Graphene: Status and Prospects," *Science* 324:1530-1534, 2009. (6 pages).

Gong et al., "Rapid Selective Etching of PMMA Residues from Transferred Graphene by Carbon Dioxide," *J. Phys. Chem. C* 117:23000-23008, 2013.

Gupta et al., "Recent development in 2D materials beyond graphene," *Progress in Materials Science* 73:44-126, 2015.

Gurarslan et al., "Surface-Energy-Assisted Perfect Transfer of Centimeter-Scale Monolayer and Few-Layer $MoS_2$ Films onto Arbitrary Substrates," *ACSNano* 8(11):11522-11528, 2014.

Heyde et al., "Probing adsorption sites on thin oxide films by dynamic force microscopy," *Applied Physics Letters* 89:263107, 2006. (3 pages).

Horcas et al., "WSXM: A software for scanning probe microscopy and a tool for nanotechnology," *Review of Scientific Instruments* 78:013705, 2007. (8 pages).

Ishigami et al., "Atomic Structure of Graphene on $SiO_2$," *Nano Lett.* 7(6):1643-1648, 2007.

Jiao et al., "Creation of Nanostructures with Poly(methyl methacrylate)-Mediated Nanotransfer Printing," *J. Am. Chem. Soc.* 130:12612-12613, 2008.

Kemmere et al., "Reaction Calorimetry for the Development of Ultrasound-Induced Polymerization Processes in $CO_2$-Expanded Fluids," *Macromol. Symp.* 248:182-188, 2007.

Kim et al., "Robust graphene wet transfer process through low molecular weight polymethylmethacrylate," *Carbon* 98:352-357, 2016.

Larciprete et al., "Chemical gating of epitaxial graphene through ultrathin oxide layers," *Nanoscale* 7:12650-12658, 2015.

Li et al. "Large-Area Synthesis of High-Quality and Uniform Graphene Films on Copper Foils," *Science* 324:1312-1314, 2009. (8 pages).

Lichtenstein et al., "The Atomic Structure of a Metal-Supported Vitreous Thin Silica Film," *Angew. Chem. Int. Ed.* 51:404-407, 2012.

Lichtenstein et al., "Crystalline-Vitreous Interface in Two Dimensional Silica," *Physical Review Letters* 109:106101, 2012. (5 pages).

Lichtenstein et al., "Atomic Arrangement in Two-Dimensional Silica: From Crystalline to Vitreous Structures," *J. Phys. Chem. C* 116:20426-20432, 2012.

Lichtenstein et al., "The Structure of Two-Dimensional Vitreous Silica," dissertation, Department of Physics of the Free University of Berlin, Berlin, Germany, Oct. 2012, 127 pages.

Liu et al., "Plasmon resonance enhanced multicolour photodetection by graphene," *Nature Communications* 2:579, 2011. (7 pages).

Löffler et al., "Growth and Structure of Crystalline Silica Sheet on Ru(0001)," *Physical Review Letters* 105:146104, 2010. (4 pages).

Longchamp et al., "Ultraclean freestanding graphene by platinum-metal catalysis," *J. Vac. Sci. Technol. B* 31(2):020605, 2013. (4 pages).

Ma et al., "Two-Dimensional Oxide and Hydroxide Nanosheets: Controllable High-Quality Exfoliation, Molecular Assembly, and Exploration of Functionality," *Acc. Chem. Res.* 48:136-143, 2015.

Muller et al., "The electronic structure at the atomic scale of ultrathin gate oxides," *Nature* 399:758-761, 1999.

Novoselov et al., "Two-dimensional atomic crystals," *PNAS* 102(30):10451-10453, 2005.

Novoselov et al., "Electric Field Effect in Atomically Thin Carbon Films," *Science* 306:666-669, 2004. (5 pages).

Evonik Performance Materials GmbH, "Plexiglas® 7N," Product profile, Mar. 2018, 3 pages.

Reina et al., "Transferring and Identification of Single- and Few-Layer Graphene on Arbitrary Substrates," *J. Phys. Chem. C* 112(46):17741-17744, 2008.

Romdhane et al., "In Situ Growth of Cellular Two-Dimensional Silicon Oxide on Metal Substrates," *ACSNano* 7(6):5175-5180, 2013.

Rudenko et al., "Interfacial interactions between local defects in amorphous $SiO_2$ and supported graphene," *Physical Review B* 84:085438, 2011. (9 pages).

Schlexer et al., "Adsorption of Li, Na, K, and Mg Atoms on Amorphous and Crystalline Silica Bilayers on Ru(0001): A DFT Study," *J. Phys. Chem. C* 118:15884-15891, 2014.

Schlexer et al., "CO adsorption on a silica bilayer supported on Ru(0001)," *Surface Science* 648:2-9, 2016.

(56) References Cited

OTHER PUBLICATIONS

Song et al., "Graphene stabilized high-$_K$ dielectric $Y_2O_3$ (111) monolayers and their interfacial properties," *RSC Adv.* 5:83588-83593, 2015.
Wang et al., "Direct Observation of Graphene Growth and Associated Copper Substrate Dynamics by in Situ Scanning Electron Microscopy," *ACSNano* 9(2):1506-1519, 2015.
Wang et al., "Synthesis, properties and applications of 2D non-graphene materials," *Nanotechnology* 26:292001, 2015. (27 pages).
Wlodarczyk et al., "Atomic Structure an Ultrathin Fe-Silicate Film Grown on a Metal: A Monolayer of Clay?," *J. Am. Chem. Soc.* 135:19222-19228, 2013.
Xu et al., "Graphene-Like Two-Dimensional Materials," *Chem. Rev.* 113:3766-3798, 2013.
Yang et al., "Patterned Defect Structures Predicted for Graphene Are Observed on Single-Layer Silica Films," *Nano Lett.* 13:4422-4427, 2013.
Yang et al., "Ultrathin silicatene/silicon-carbide hybrid film on a metal substrate," *Surface Science* 632:9-13, 2015.
Yu et al., "Support effects on the atomic structure of ultrathin silica films on metals," *Applied Physics Letters* 100:151608, 2012. (5 pages).
Zhang et al., "Review of Chemical Vapor Deposition of Graphene and Related Applications," *Accounts of Chemical Research* 46(10):2329-2339, 2013.

* cited by examiner a)

b)

TRANSFERABLE SILICA BILAYER FILM

TECHNICAL FIELD

The present invention relates to a silica bilayer film supported by a removable polymer film, a process for producing said supported silica bilayer film, a process for transferring a silica bilayer film, a free-standing silica bilayer film, a stack comprising a plurality of silica bilayer films, a field-effect transistor comprising a silica bilayer film or a stack thereof and a use of the silica bilayer film or the stack.

BACKGROUND OF THE INVENTION

In recent years, progress has led to a miniaturization in numerous technological fields, for example field-effect transistors and integrated circuits such as microprocessors containing millions of transistors. In metal-oxide-semiconductor field-effect transistors (MOSFET), the layer of an electrical insulator such as silica ($SiO_2$) used as gate oxide can be as thin as 20 nm.

Not only other electronic devices or components such as capacitors but also passivation and separation applications require even thinner insulating or passivating materials.

For further technical development, there is a demand for ultrathin insulators and processes, which can be efficiently used in industrial processes. However, processes and materials known in the art for introducing or installing an ultrathin insulator are often complex, expensive or do not render possible the necessary precise control of the thickness of the materials. For instance, one attempt on reducing the insulator thickness has been the oxidation of silicon surfaces, but defects such as oxygen vacancies occur, which can cause leakage currents and thus limit the thickness and potential applications of the insulator.

Therefore, it is an object of the present invention to provide a material and a process that enable the use of an ultrathin insulator, in particular an atomically defined insulator, and satisfy the needs arising from the prior art. Further objects are directed at the provision of an ultrathin insulator, stacks of the ultrathin insulator, applications and uses of the ultrathin insulator or the stack thereof.

SUMMARY OF THE INVENTION

The present invention relates to a silica bilayer film supported by a removable polymer film, a process for producing said supported silica bilayer film, a process for transferring a silica bilayer film, a free-standing silica bilayer film, a stack comprising a plurality of silica bilayer films, a field-effect transistor comprising a silica bilayer film or a stack thereof and a use of the silica bilayer film or the stack.

The present invention includes the following embodiments ("items"):

1. A supported silica bilayer ($SiO_2$ bilayer) film, wherein the silica bilayer film consists of two atomic layers of corner-sharing $SiO_4$ tetrahedra, forms in itself a chemically saturated structure and contains pores, the silica bilayer film has a first and a second side and is supported on the first side by a removable polymer film.
2. The supported silica bilayer film according to item 1, wherein the silica bilayer film has a thickness of 0.3 to 1 nm, preferably 0.4 to 0.6 nm, more preferably approx. 0.5 nm, as measured by density functional theory DFT calculations.
3. The supported silica bilayer film according to item 1 or 2, wherein the number average diameter of the pores lies in the range of 4 to 20 nm, in particular 5 to 10 nm, as measured by high resolution STM.
4. The supported silica bilayer film according to any of items 1, 2 and 3, wherein the silica bilayer film contains pores formed in the silica bilayer film having a diameter of up to 50 nm, preferably 20 to 40 nm, as identified by ESEM.
5. The supported silica bilayer film according to any of items 1, 2, 3 and 4, wherein the total volume of the pores contained in the silica bilayer film amount to 5.0 to 35.0 vol. %, preferably 10.0 to 25.0 vol. %, based on the total volume of the silica bilayer film and the pores contained therein.
6. The supported silica bilayer film according to any of items 1, 2, 3, 4 and 5, wherein the total area of the silica bilayer film and the pores contained therein have an average coverage of 1.30 to 1.90 monolayers, preferably 1.50 to 1.80 monolayers, when a silica bilayer film without any pores is considered to be 2.00 monolayers.
7. The supported silica bilayer film according to any of items 1, 2, 3, 4, 5 and 6, wherein the silica bilayer film (i) is amorphous or (ii) consists of amorphous and crystalline domains.
8. The supported silica bilayer film according to item 7, wherein the silica (i.e. the corner-sharing $SiO_4$ tetrahedra) forms a polygonal network, in which the polygons (i.e. the polygonal rings) have different shapes and sizes.
9. The supported silica bilayer film according to item 8, wherein the polygons comprise polygonal rings selected from rings formed each by 5, 6, 7 Si—O units, optionally also from rings formed by 4, 8 and 9 Si—O units.
10. The supported silica bilayer film according to item 8 or 9, wherein the polygonal rings formed by 5, 6, and 7 Si—O units account for at least 50%, preferably at least 65%, more preferably at least 80%, of all ring structures occurring in the amorphous domains.
11. The supported silica bilayer film according to any of items 7, 8, 9 and 10, wherein the crystalline domains constitute less than 50%, preferably less than 40%, more preferably 10 to 30%, of the silica bilayer film, the remainder being amorphous.
12. The supported silica bilayer film according to any of items 1, 2, 3, 4, 5, 6, 7, 8, 9, 10 and 11, wherein the removable polymer film is selected (i) from poly(methyl methacrylate) (PMMA)-based films, (ii) from poly(bisphenol A carbonate) (PC)-based, polystyrene (PS)-based, and poly(dimethyl siloxane) (PDMS)-based films, and (iii) from thermal release tapes (TRT).
13. The supported silica bilayer film according to any of items 1, 2, 3, 4, 5, 6, 7, 8, 9, 10, 11 and 12, wherein the removable polymer film is a poly(methyl methacrylate) (PMMA)-based film.
14. The supported silica bilayer film according to item 12 or 13, wherein the PMMA, on which the removable polymer film is based, is soluble at room temperature (25° C.) in acetone at a concentration of 20 wt. %.
15. The supported silica bilayer film according to any of items 12, 13 and 14, wherein the PMMA, on which the removable polymer film is based, has a density of 1.18 to 1.20 $g/cm^3$, preferably 1.19 $g/cm^3$.
16. The supported silica bilayer film according to any of items 12, 13, 14 and 15, wherein the PMMA, on which the removable polymer film is based, has a weight average molecular weight of 10 to 1,000 kDa, preferably 15 to 350 kDa, more preferably 20 to 150 kDa, as measured by gel permeation chromatography (GPC).

17. The supported silica bilayer film according to any of items 1, 2, 3, 4, 5, 6, 7, 8, 9, 10, 11, 12, 13, 14, 15 and 16, wherein the silica bilayer film is not attached to a growth substrate and wherein the second side is preferably exposed.

18. A process for producing the supported silica bilayer film according to any of items 1, 2, 3, 4, 5, 6, 7, 8, 9, 10, 11, 12, 13, 14, 15, 16 and 17, the process comprising the steps of:

(A) forming a silica bilayer film on Ru(0001) as a growth substrate by physical vapor deposition and subsequent annealing, wherein the silica bilayer film consists of two atomic layers of corner-sharing $SiO_4$ tetrahedra, forms in itself a chemically saturated structure and contains pores, wherein the silica bilayer film has a first and a second side, the second side being in contact with the growth substrate;

(B) forming a removable polymer film based on poly (methyl methacrylate) (PMMA) on the first side of the silica bilayer film, and wherein the PMMA is preferably a PMMA as defined in any of items 14, 15 and 16; and (C) lifting off the silica bilayer film together with the removable polymer film based on PMMA from the growth substrate;

(D) optionally transferring the silica bilayer film from the removable polymer film based on PMMA to another removable film based on a different polymer.

19. The process according to item 18, wherein step (A) comprises the following substeps:

A1) pre-covering the surface of the growth substrate with oxygen at reduced pressure, and wherein step A1) is preferably conducted at a temperature of 950 to 990° C. and a pressure of 1.9 to $2.3 \times 10^{-6}$ mbar;

A2) depositing at reduced pressure a predetermined amount of silicon in an oxygen atmosphere on the growth substrate, said amount of silicon being required for forming a silica bilayer film having a predetermined porosity, and wherein step A2) is preferably conducted at a temperature of 100 to 300° C. and a pressure of 1.9 to $2.3 \times 10^{-7}$ mbar; and A3) subjecting the growth substrate onto which a predetermined amount of silicon has been deposited to an annealing step in an oxygen atmosphere at reduced pressure, and wherein step A3) is preferably conducted at a temperature of 980 to 1000° C. and a pressure of 1.9 to $2.3 \times 10^{-6}$ mbar.

20. The process according to item 18 or 19, wherein the removable polymer film based on PMMA is formed by spin-coating.

21. The process according to item 20, wherein a PMMA solution is used for spin-coating and the concentration of PMMA in the solution is in the range of 10 to 30 wt. %, preferably 15 to 22 wt. %, more preferably 20 to 21 wt. %.

22. The supported silica bilayer film according to any of items 1, 2, 3, 4, 5, 6, 7, 8, 9, 10, 11, 12, 13, 14, 15, 16 and 17 and the process according to any of items 18, 19, 20 and 21, wherein the thickness of the removable polymer film is in the range of up to 2 mm, preferably 0.05 to 1 mm, more preferable 0.1 to 0.5 mm, for example 0.3 mm.

23. The process according to any of items 18, 19, 20, 21 and 22, wherein step (D) comprises the following substeps:

D1) arranging the supported silica bilayer obtained in step (C) according to one of the embodiments described herein on the upper side of a substrate such that the upper side of the substrate is in contact with the exposed second side of the supported silica bilayer film while the removable PMMA film supporting the silica bilayer film is located on the first side of the silica bilayer film, which is opposite to the substrate;

D2) removing the removable PMMA film from the silica bilayer film thereby transferring the silica bilayer film to the substrate;

D3) forming a another removable polymer film on the first side of the silica bilayer film, wherein the other removable polymer film is preferably is selected from poly(bisphenol A carbonate) (PC)-based, polystyrene (PS)-based, and poly(dimethyl siloxane) (PDMS)-based films, and thermal release tapes (TRT); and D4) lifting off the silica bilayer film together with the removable polymer film from the substrate.

24. A process for transferring a silica bilayer film to a substrate, comprising the steps:

(1) arranging a supported silica bilayer film according to any of 1, 2, 3, 4, 5, 6, 7, 8, 9, 10, 11, 12, 13, 14, 15, 16, 17 and 22 on the upper side of a substrate such that the upper side of the substrate is in contact with the exposed second side of the supported silica bilayer film while the removable polymer film supporting the silica bilayer film is located on the first side of the silica bilayer film, which is opposite to the substrate; and (2) removing the removable polymer film from the silica bilayer film thereby transferring the silica bilayer film to the substrate.

25. The process according to item 24, wherein, in step (2), the removable polymer film is based on poly(methyl methacrylate) (PMMA) and removed by evaporation, preferably at a temperature in the range of 235° C. to 300° C., and wherein the PMMA is preferably a PMMA as defined in any of items 14, 15 and 16.

26. The process according to item 24 or 25, wherein, after step (2), the silica bilayer film and the support are heated under high (less than 1 mbar) or ultrahigh (less than $10^{-4}$ mbar, preferably less than $5 \times 10^{-6}$ mbar) vacuum to a temperature of more than 300° C., for example 400 to 1000° C.

27. A silica bilayer film, wherein the silica bilayer film consists of two atomic layers of corner-sharing $SiO_4$ tetrahedra, forms in itself a chemically saturated structure and contains pores;

characterized in that the silica bilayer film is free-standing.

28. A free-standing silica bilayer film obtainable by the process of according to any of items 24, 25 and 26.

29. The free-standing silica bilayer film according to item 27 or 28, wherein the silica bilayer film is self-supporting over an area of at least 1 $\mu m^2$, preferably at least 2 $\mu m^2$, more preferably at least 5 $\mu m^2$.

30. The free-standing silica bilayer film according to any of items 27, 28 and 29, wherein the silica bilayer film is placed on a TEM grid.

31. The free-standing silica bilayer film according to any of items 27, 28, 29 and 30, wherein at least 10%, preferably 40 to 80%, of the area on each side of the film are exposed to a fluid.

32. A stack comprising two, three or more silica bilayer films, wherein each silica bilayer film consists of two atomic layers of corner-sharing $SiO_4$ tetrahedra, forms in itself a chemically saturated structure and contains pores.

33. The stack according to item 32, selected from (i) a stack consisting of two, three or more silica bilayer films which are directly arranged on top of each other, or (ii) a stack comprising in any order, or consisting in any order of, two, three or more silica bilayer films and at least one further two-dimensional material which is preferably selected from the group consisting of graphene, boron nitride, carbon nitride, boron carbon nitride, transition metal oxide-based materials and transition metal sulfide-based materials (for example $MoS_2$, $WS_2$, layered copper oxides, layered tungsten, niobium and titanium oxides), transition metal selenides, transition metal tellurides, bismuth selenide, indium selenide and gallium telluride, wherein the at least one further two-dimensional material is preferably arranged in between the silica bilayer films.

34. A field-effect transistor, which contains a gate oxide separating a gate terminal from a body of a semiconductor material, wherein
the gate oxide comprises
(i) a silica bilayer film, wherein the silica bilayer film consists of two atomic layers of corner-sharing $SiO_4$ tetrahedra, forms in itself a chemically saturated structure and contains pores, said film being preferably obtained by the process to any of items 24, 25 and 26; or
(ii) a stack according to item 32 or 33.

35. Use of a silica bilayer film obtainable by a process according to any of items 24, 25 and 26, a silica bilayer film according to any of items 27, 28, 29, 30 and 31 or a stack according to item 32 or 33 as
a passivating layer, in particular for corrosion protection, fouling protection, solvent protection or as separation layer;
a membrane, in particular for filtration applications, desalination applications, gas separation, atomic and molecular storage capacities such as atomic or molecular sieves;
an electrically insulating layer, in particular for thin layer electronic devices, e.g. as gate oxide, multilayer components, thin film capacitors and batteries.

Where the present description refers to "preferred" embodiments/features, combinations of these "preferred" embodiments/features shall also be deemed as disclosed as long as this combination of "preferred" embodiments/features is technically meaningful.

Hereinafter, the use of the term "comprising" should be understood as disclosing, as a more restricted embodiment, the term "consisting of" as well, as long as this is technically meaningful.

It should be noted that hereinafter the description of broader and narrower ranges also discloses embodiments in which the lower and upper limits are combined in a different manner.

DETAILED DESCRIPTION OF THE PRESENT INVENTION

1 Supported Silica Bilayer Film (1) One aspect of the present invention relates to a supported silica bilayer film. In the supported silica bilayer film,
the silica bilayer film consists of two atomic layers of corner-sharing $SiO_4$ tetrahedra, forms in itself a chemically saturated structure and contains pores,
the silica bilayer film has a first and a second side and is supported on the first side by a removable polymer film Herein, "silica" strictly denotes "$SiO_2$". The structure of the silica bilayer film is a network formed by corner-sharing $SiO_4$ tetrahedra. The two "atomic layers" relate to two layers of said $SiO_4$ tetrahedra bilayer, which are arranged on top of each other and interconnected via Si—O—Si linkages of the corner-sharing $SiO_4$ tetrahedra, so that a silica bilayer is formed. In the atomic layers of said $SiO_4$ tetrahedra, the Si atoms are arranged at the same level. Due to its very low thickness, the silica bilayer film can also be referred to as so-called "2D (two-dimensional) material". The highly regular arrangement of Si and O atoms on both sides (surfaces) also leads to an even (flat) surface structure (if the pores are not considered) said even structure being beneficial for many applications.

The silica bilayer film forms in itself a "chemically saturated structure", that is, a self-saturated structure. According to the present invention a chemically saturated structure is present if each tetravalent silicon atom forms four oxygen bonds to the adjacent four silicon atoms, and hence there are no unsaturated valences in the structure. This structure can be verified by means of high resolution STM images (STM=scanning tunneling microscopy) as described by Lichtenstein et al. *Angew. Chem. Int. Ed.* 2012, 51, 404. Hence, it does not form a measurable amount of covalent bonds to another material being different from the silica bilayer film such as the polymer support.

Figure 1:
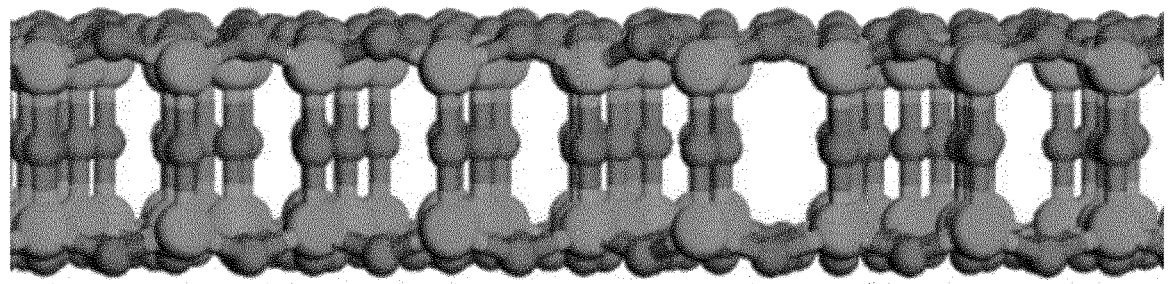
FIG. 1 illustrates a side view of a silica bilayer film model.

In FIG. 1, the side view of a schematic model of a silica bilayer film of the invention is shown, which illustrates the chemically saturated bilayer structure thereof. The silicon atoms (large and light gray in FIG. 1) are arranged in two layers and each silicon atom is bound to four oxygen atoms (small and dark gray in FIG. 1) forming $SiO_4$ tetrahedra. The $SiO_4$ tetrahedra form a network by sharing corners. The network has two atomic layers of corner-sharing $SiO_4$ tetrahedra and the layers are interconnected via Si—O—Si linkages.

For the first time the inventors have successfully lifted off a silica bilayer film from a growth substrate by mechanical exfoliation. Due to the supporting removable polymer film, the silica bilayer can be handled and transferred onto a target substrate of choice. As the polymer film is removable, it can be subsequently detached or otherwise removed from the silica bilayer film. Hence, the removable polymer film serves as a "vehicle" for transferring the silica bilayer to a new substrate and can be used as a "handle" for transporting or otherwise moving the silica bilayer film.

From graphene, it is known that mechanical exfoliation can cause significant mechanical stress when a layer of graphene is lifted off its growth substrate. This is one reason why the prior art frequently makes use of intercalation techniques in order to reduce the interaction and bonding between substrate and thin graphene film before the thin film is lifted off.

Accordingly, one could assume that mechanical exfoliation would cause significant mechanical stress to a silica bilayer film when it is detached from its growth substrate. In addition, in view of the significantly higher bond energies of the C—C bonds in graphene in comparison to the Si—O bonds in silica, one could further assume that graphene should tolerate higher mechanical stress than silica. This might be reasons why attempts on the exfoliation of silica bilayer films have, to the best of the inventors' knowledge, not yet been reported.

However, the inventors surprisingly discovered that, without the use of any intercalation techniques, a specific procedure (described in more detail below) enables quantitative detachment of an essentially intact silica bilayer film from the growth substrate if this film is supported by a removable polymer film. Even more surprising, the inventors have found that the polymer film can be removed successfully and quantitatively from the silica bilayer without damaging the film. For a 2D material, quantitative removal means without leaving traces behind, as any material left would adversely affect the quality of the atomically even surface. These findings provide for the first time in the art access to a free-standing silica bilayer film.

Herein, "essentially intact" and "essentially without damaging" mean that the silica bilayer film essentially maintains its structural integrity and essentially no structural defects, such as wrinkles, tears or folded over areas, caused by the mechanical exfoliation, are observed by high resolution STM after completion of the respective process. "Essentially" means in this context that the porosity of the film does not increase by more than 10% during exfoliation, preferably by not more than 5%. In one preferred embodiment, there is no difference between the porosity of the film before and after exfoliation within the applicable measurement preciseness.

In view of the above, it is apparent that the removable supported silica bilayer film enables the use of the silica bilayer film and, thus, of an insulating material with atomically defined thickness for various applications. Hence, with the supported silica bilayer film of the present invention in hands, the door has been opened for various nanotechnology applications of the silica bilayer film such as passivation, membrane and insulating applications.

The silica bilayer film preferably has a thickness of 0.3 to 1 nm, more preferably 0.4 to 0.6 nm (approx. 0.5 nm) as measured by density functional theory DFT calculations. Note that this value is defined as the distance between the topmost and bottommost oxygen atoms (center position of the nuclei) that are located at the same position in a plan view of the silica bilayer film. Many possible applications of the silica bilayer film of the present invention, especially when the insulating properties thereof are utilized, require the precise control of the thickness of the silica materials. Since two, three or more silica bilayer films can be arranged on top of each other to form a stack as described in more detail below, the thickness of the (insulating) silica material can be controlled and defined on an atomic level, namely by stacking the required number of silica bilayer films.

Conventional processes for generating a thin silicon dioxide-based insulator film on silicon, which are based on oxidizing the silicon surface to form a thin silicon dioxide-based layer thereon, often result in a silicon dioxide material having oxygen vacancies and other structural defects. These defects can cause leakage currents, so that there is a limit regarding the thickness of the silicon dioxide layer for insulator applications, for example as gate oxide in MOSFETs. In contrast to this, the supported silica bilayer film of the present invention is free of such structural defects and the silica bilayer film can be transferred quantitatively as an essentially intact film. Hence, the silica bilayer film can be installed in a device while maintaining its self-saturated structure. In consequence, significantly less or even no leakage currents are observed, so that the silica bilayer film can be used as a very effective wide band gap insulator.

Therefore, using the supported silica bilayer film as a vehicle, thinner electrically insulating spacers of high quality consisting of the silica bilayer or a stack thereof can be formed, which enables the production of smaller field-effect transistors, integrated circuits, capacitors, batteries or other nanotech devices.

One feature of the supported silica bilayer film is that it contains pores. The pores can be generated during the formation of the silica bilayer film by physical vapor deposition and a subsequent annealing step as explained below.

Two types of pores can be present in the bilayer film as formed on the growth substrate, i.e.
1) pores in the upper of the two atomic layers (in the following "first atomic layer"), i.e. on the first side of the film that is in contact with the removable polymer film during exfoliation, and/or
2) pores that extend through both atomic layers.

Without being bound to theory, the inventors assume that the manufacturing process of the present invention does not result in the formation of (closed) pores in the lower of the two atomic layers (in the following "second atomic layer"), i.e. on the second side of the bilayer film, which is in contact with the growth substrate before exfoliation. It is worthwhile noting that the pores do not constitute structural defects, because the silica bilayer film is also self-saturated in the sections surrounding the pores.

The pores formed in the silica bilayer film can be observed and their volume measured by high resolution STM if the first side of the silica bilayer film (i.e. the side opposite to the growth substrate or a target substrate) is exposed. STM also allows for distinguishing between pores extending through the entire silica bilayer film and those that are formed only in the first (upper) atomic layer. The number average diameter of said pores lies typically in the range of 4 to 20 nm, in particular 5 to 10 nm as measured by high resolution STM. However, occasionally, there are also larger pores formed in the silica bilayer film having a diameter of up to 50 nm, for example 20 to 40 nm, which can be identified by ESEM (environmental scanning electron microscopy).

(2) The pores contained in the silica bilayer film can be characterized by their volume. The total volume of the pores preferably amounts to 5.0 to 35.0 vol. % (vol. %=% by volume), preferably 10.0 to 25.0 vol. %, based on the total volume of the silica bilayer film and the pores contained therein. The total volume of the pores can be determined by measuring by high resolution STM, in a plan view of the silica bilayer film, the area of the pores, and determining the type of pores, i.e. the number of layers in which they are contained (1 or 2). In the case of pores that extend through the entire silica bilayer film, the total area proportion covered by the pores (expressed in %) in the plan view is considered to correspond to the pore volume (in %). In case of pores that are only present in the first atomic layer (i.e. the layer not being in contact with the growth substrate before exfoliation), the total area proportion covered by these pores (expressed in %) in the plan view needs to be divided by two to arrive at the corresponding pore volume (in %).

If it is assumed that, for example, in the analyzed plan view pores extending through the entire film amount to 8.5% of the total area and pores that are only formed in the first atomic layer amount to 7.0% of the area, then the volume of the pores is 8.5 vol. %+(0.5×7.0 vol. %)=12.0 vol. %, based on the total volume of the silica bilayer film and the pores contained therein.

The measurement of the pore volume is further explained in the examples of the present application, in particular in item 2 of the analytical methods.

Alternatively, the silica bilayer film containing pores can be characterized by the average coverage of the total area of the silica bilayer film and the pores contained therein. To this end, the average coverage can be expressed as theoretical "number of monolayers", wherein the term "monolayer" refers to a pore-free atomic layer of corner-sharing $SiO_4$ tetrahedra forming a silica bilayer film. Thus, a silica bilayer film without any pores is considered to have a coverage of 2.00 monolayers. Following this approach, the total area of the silica bilayer film and the pores contained therein preferably have an average coverage of 1.30 to 1.90 monolayers and preferably 1.50 to 1.80 monolayers, when a silica bilayer film without any pores is considered to be 2.00 monolayers. In the example described in the previous paragraph, the average coverage is (1.00−0.085)+(1.00−0.085−0.070)=0.915+0.845=1.76 monolayers. Hence, an average coverage of 1.76 monolayers corresponds to a pore volume of 12.0 vol. %.

As described in more detail below, the silica bilayer film can be obtained by physical vapor deposition of silicon on a Ru(0001) growth substrate pre-covered with oxygen. By adjusting the amount of silicon supplied by the evaporators and the duration of the physical vapor deposition treatment, the total amount of silicon deposited per area unit and thereby also the volume of the pores can be adjusted during the process for forming the supported silica bilayer film. Since pore volume and average coverage inversely correlate with each other, more deposited silicon per area unit will result in a smaller pore volume and, thus, in a higher average coverage.

Although one could assume that the presence of pores can also weaken the stability of the silica bilayer film, the inventors surprisingly discovered that the silica bilayer film can be mechanically exfoliated from its growth substrate and also be successfully transferred onto a new substrate using the processes described in more detail below. The process for depositing the silica bilayer film on the growth substrate is preferably controlled as such that the total volume of the pores and, accordingly, the average coverage with the silica bilayer film are within the above ranges, because the pores seem to facilitate the mechanical exfoliation of the supported silica bilayer film from the growth substrate. Without being bound to theory, the inventors assume that the pores improve the interaction with the removable PMMA film formed thereon.

The silica bilayer film of the present invention is (i) amorphous or (ii) consists of amorphous and crystalline domains.

In amorphous regions (amorphous domains), the silica (i.e. the corner-sharing $SiO_4$ tetrahedra) preferably forms a polygonal network, in which the polygons have different shapes and sizes. The STM analysis also reveals that, if pores are present, the amorphous domains preferably comprise polygonal rings selected from rings formed each by 5, 6, 7 Si—O units, optionally also from rings formed by 4, 8 and 9 Si—O units. The most frequently occurring ring has 6 Si—O units, i.e. is formed by 6 silicon and 6 oxygen atoms. Rings with more than 6 Si—O units tend to be surrounded by smaller rings. Rings formed by 5, 6, and 7 Si—O units account for at least 50%, preferably at least 65%, more preferably at least 80% of all ring structures occurring in the amorphous domains. Due to rings of different size, the silica bilayer film may be used in various membrane applications for the separation of compounds.

Since silica crystallizes in a hexagonal lattice, one can easily discern between hexagonal, crystalline regions (crystalline domains) and amorphous domains in high resolution STM images. Therefore, the content of crystalline domains and amorphous domains, respectively, can be determined by comparing the areas in the STM images covered by hexagonal and amorphous patterns, as explained in further detail in the examples of the present application, in particular in item 3 of the analytical methods.

Figure 2:
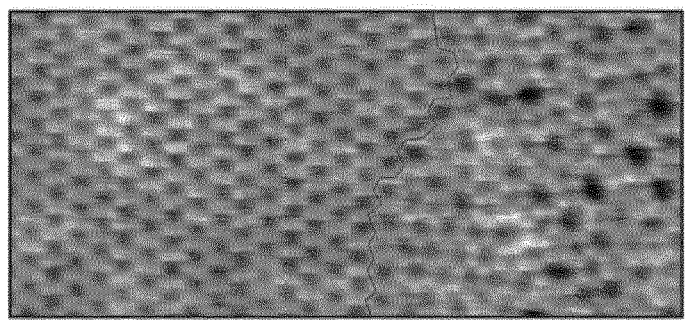
FIG. 2 shows a high resolution STM picture of a silica bilayer film having crystalline and amorphous regions.

In FIG. 2 a high resolution STM picture (12.6 nm×6.5 nm, $V_S$=2 V, $I_T$=100 pA) of a silica bilayer film is shown. In the section depicted in FIG. 2, the silica bilayer film has a crystalline region (domain) located on the left-hand side of FIG. 2, which is easily recognizable by its regular hexagonal pattern. It can be clearly discerned from the amorphous region located on the right-hand side of FIG. 2 having a polygonal pattern without a long range order. For better illustration, the borderline between the crystalline and amorphous regions is indicated in FIG. 2.

(3) According to one preferred embodiment of the silica bilayer film, the crystalline domains preferably constitute less than 50%, more preferably less than 40% of the silica bilayer film, the remainder being amorphous. Preferably, the amorphous silica bilayer film contains 10 to 30% crystalline domains.

The inventors surprisingly found that a greater proportion of amorphous domains in the silica bilayer film of the invention facilitates the exfoliation from the growth substrate and the transfer onto a new substrate as described in more detail below. The inventors assume that the amorphous domains exhibit weaker attractive forces with the growth substrate than a fully crystalline film. Without being bound to theory, it is believed that the amorphous domains of the silica bilayer film exhibit less or even no registry (epitaxy) to the growth substrate than a crystalline domain resulting in weaker interactions with the growth substrate.

The inventors assume that the content of amorphous and crystalline domains can be controlled via the formation of pores. As a general rule, the higher the volume of the pores and, accordingly, the lower the average coverage with the silica bilayer film, the higher is the content of amorphous regions.

Thus, according to one particularly preferred embodiment, the silica bilayer film contains less than 40%, preferably 10 to 30%, of crystalline domains, the pores preferably have the number average diameter as described above, and the total volume of the pores contained in this silica bilayer film can amount to 5.0 to 35.0 vol. %, preferably 10.0 to 25.0 vol. %, based on the total volume of the silica bilayer film and the pores contained therein.

According to one preferred embodiment, the removable polymer film is selected from film-forming thermoplastic materials. Further, it is preferred to select the removable polymer film from (i) poly(methyl methacrylate) (PMMA)-based films, (ii) from poly(bisphenol A carbonate) (PC)-based, polystyrene (PS)-based, and poly(dimethyl siloxane) (PDMS)-based films and (iii) from thermal release tapes (TRT).

Suitable kinds of PMMAs for preparing PMMA-based films are described below. Preferred types of poly(bisphenol A carbonate), polystyrene, and poly(dimethyl siloxane) are those which can be spin-coated in the same manner as described below for PMMA (see also below step D3) of the process for preparing the supported silica bilayer film).

Thermal release tapes are commercially available, e.g. REVALPHA® from Nitto Europa. They behave like normal adhesive tape at room temperature but, when the tape is to be removed, they can be easily peeled off by simply applying heat thereto.

Preferably, the film is made from a PMMA polymer which does not contain any further auxiliary substances that could lead to the formation of residues during evaporation. In one preferred embodiment, the film hence contains the PMMA polymer as sole polymer component. The term "PMMA polymer" is intended to denote homo- and copolymers which contain methyl methacrylate (MMA) as main constituent unit, i.e. in an amount of more than 50 mol-%, preferably at least 80 mol-%, even more preferably at least 90 mol-%. In one embodiment, the PMMA polymer is a PMMA homo-polymer.

Preferred types of PMMA are those which are soluble at room temperature (25° C.) in acetone at a concentration of 20 wt. %. The PMMA may have a density of 1.18 to 1.20 g/cm$^3$, such as 1.19 g/cm$^3$. The molecular weight of the PMMA is apparently not critical. For example, the PMMA may have a weight average molecular weight of 10 to 1,000 kDa, preferably 15 to 350 kDa, more preferably 20 to 150 kDa, as measured by gel permeation chromatography (GPC). A suitable PMMA may, for example, be a non-crosslinked PMMA, having, for example, a molecular weight of approx. 120 kDa and a melting interval of approx. 130° C. to approx. 200° C.

Using PMMA as removable polymer brings several advantages, because it is the polymer material of choice for lifting off the silica bilayer film from the growth substrate according to transfer process of the present invention. In addition, it is inexpensive and can be removed quantitatively by evaporation, preferably at temperatures of at least 235° C., preferably 235 to 300° C. Hence, PMMA is particularly suitable for transferring the silica bilayer film on substrates, which can be heated to 235° C. or more. The silica bilayer film has a good thermal stability and tolerates temperatures of up to 1000° C.

If PMMA has been used for lifting off the silica bilayer film from the growth substrate, this removable polymer film can then be substituted for any removable polymer film including those specified above items (ii) and (iii).

(4) After exfoliating the supported silica bilayer film according to the present invention from the growth substrate used for forming the silica bilayer film, it is no longer attached thereto and can be freely placed on any other substrate. Hence, the supported silica bilayer film is not attached to a growth substrate, which is suitable for growing a silica bilayer film, which consists of two atomic layers of corner-sharing SiO$_4$ tetrahedra, forms in itself a chemically saturated structure and contains pores according to one of the above-described embodiments.

In one preferred embodiment, the second side of the supported silica bilayer film is exposed. Herein "exposed" means that it is in contact with a fluid, which is understood to be air, a gas, a mixture of gases or a liquid.

The formation of silica films by physical vapor deposition has been previously reported using Ru(0001), Pt(111), Pd(100), Co(0001) or graphene on copper as growth substrates. In light of the above, after exfoliation, the supported silica bilayer film is also not attached to any these growth substrates and if being in contact with any of these substrates can be freely moved and repositioned while remaining essentially intact.

2 Process for Producing the Supported Silica Bilayer (5) A further aspect of the present invention relates to a process for producing the supported silica bilayer film according to one of the embodiments described above. The process comprises the steps of:

(A) forming a silica bilayer film on Ru(0001) as a growth substrate by physical vapor deposition and subsequent annealing, wherein the silica bilayer film consists of two atomic layers of corner-sharing SiO$_4$ tetrahedra, forms in itself a chemically saturated structure and contains pores, the silica bilayer film has a first and a second side;

(B) forming a removable polymer film based on poly (methyl methacrylate) (PMMA) on the first side of the silica bilayer film; and (C) lifting off the silica bilayer film together with the removable polymer film based on PMMA from the growth substrate;

(D) optionally transferring the silica bilayer film from the removable polymer film based on PMMA to another removable film based on a different polymer.

As mentioned above, the silica bilayer film in the supported silica bilayer film produced by this process is lifted off the growth substrate essentially without damaging the ultrathin silica material, i.e., with preservation of its structure. It is one surprising finding of the present invention that the interaction between the removable polymer film formed on the first side of the grown silica bilayer film is strong enough for lifting off the silica film from the growth substrate.

Herein, "lifting off" is understood as a mechanical exfoliation without solvent assistance such as intercalation of a solvent between growth substrate and silica bilayer film. The inventors found that a mechanical exfoliation of the silica bilayer films supported by the PMMA film is required, because various other techniques to detach the silica bilayer film failed.

For example, experiments, using solvent-assisted exfoliation techniques, which are known from the exfoliation of silicate layers from clays, were unsuccessful. Said experiments adapted the method as described in M. Alexandre et al., *Mater. Sci. Eng. R Reports* 2000, 28, 1. In this approach, the solvent is deposited on the surface and migrates into the interface between substrate and the layer to be detached ("intercalation") thereby reducing the attractive forces between substrate and layer. Using a "handle" made of polymer or adhesive tape the uppermost layer can then be exfoliated.

However, all attempts to remove a silica bilayer film of the type provided in the present invention from a corresponding growth substrate using ultrapure water, ethanol and acetone as solvent were unsuccessful. The silica bilayer film could not be lifted off together with any "handle", but remained essentially intact on the growth substrate. Even when using the preferred amorphous silica bilayer film containing pores and having a total volume of 10.0 to 25.0 vol. %, based on the total volume of the silica bilayer film and the pores contained therein, solvent-assisted exfoliation remained unsuccessful.

Moreover, mechanical exfoliation using an adhesive tape, which is a technique known for transferring graphite layers from highly oriented pyrolytic graphite (HOPG) were unsuccessful. The experiments using an adhesive tape adapted a method that is described in K. Novozelov et al., *Science* 2004, 306, 666. The silica layer remained attached to the growth substrate. The inventors assume that using the right "handle" is of importance, because in-situ formation of a removable PMMA film allowed for successful exfoliation, whereas the above-described attempts failed even when using a strongly adhesive tape. However, a supported silica bilayer film according to the present invention using other removable polymer films than a PMMA film as support can be easily produced by transfer of the silica bilayer film in step (D) once the same has been lifted off the growth substrate using a PMMA-based film (step (C)).

In addition to successful and quantitative exfoliation, the process for making the supported silica bilayer film according to the present invention provides several advantages. At first, formation of the PMMA film is inexpensive and can be accomplished by standard techniques such as spin-coating.

Moreover, since the silica bilayer film is supported by the removable polymer film, it remains as flat as on the growth substrate, so that it can be easily transferred onto a new substrate. A process leading to a rolled-up silica bilayer film would not be of any use, because there are, to the best of the inventors' knowledge, no means available for stretching an ultrathin silica film once it is rolled-up.

A further advantage of the process according to the present invention is that the growth substrate can be reused for forming a further silica bilayer films. Processes that use a step for etching the substrate would be highly expensive and unacceptable for producing the silica bilayer film on a scale large enough for applications in industry such as production of field-effect transistors. In addition, if, for example, graphene on copper were used as substrate, the graphene layer would remain on the silica bilayer after etching the copper substrate, which limits potential applications of the silica bilayer film.

In step (A), the silica bilayer film is formed by physical vapor deposition on Ru(0001) as growth substrate. According to the present invention Ru(0001) has been selected as growth substrate as it allows for successful mechanical exfoliation of the silica bilayer film formed thereon.

Suitable techniques for physical vapor deposition are known to the person skilled in the art. Reference can also be made to L. Lichtenstein et al., *Angew. Chem. Int. Ed.* 2012, 51, 40 (incorporated by reference) describing the formation of a silica bilayer film with a greater proportion of amorphous domains. However, the silica bilayer film described therein cannot be lifted off or repositioned on the growth substrate (Ru(0001)) without damaging the film. A specific exfoliation technique as described for the first time in the present invention is required for lifting off this film essentially intact as well as providing the same as free-standing silica film.

In one preferred embodiment, step (A) comprises the following substeps:
A1) pre-covering the surface of the growth substrate with oxygen at reduced pressure,
A2) depositing at reduced pressure a predetermined amount of silicon in an oxygen atmosphere on the growth substrate, said amount of silicon being required for forming a silica bilayer film having a predetermined porosity,
A3) subjecting the growth substrate onto which a predetermined amount of silicon has been deposited to an annealing step in an oxygen atmosphere at reduced pressure.

Step A1) is preferably conducted at a temperature of 950 to 990° C. and a pressure of 1.9 to $2.3 \times 10^{-6}$ mbar.

Step A2) is usually conducted by calibrating the amount of silicon supplied by the evaporator and adjusting the deposition time accordingly. Step A2) is preferably conducted at a temperature of 100 to 300° C. and a pressure of 1.9 to $2.3 \times 10^{-7}$ mbar.

After the completion of step A2), a bilayer with a regular arrangement of $SiO_4$ tetrahedra has not yet formed. To this end, annealing step A3) is employed. Step A3) is preferably conducted at a temperature of 980 to 1000° C. and a pressure of 1.9 to $2.3 \times 10^{-6}$ mbar.

Preferably, the surface of the growth substrate is cleaned prior to step A1), so as to obtain an atomically flat surface for film growing. For example, the Ru(0001) surface can be cleaned by $Ar^+$ bombardment and subsequent annealing, e.g. at 1300° C. Repeating the procedure improves the cleaning effect. Sufficient cleanness of the surface can be confirmed by standard spectroscopic techniques, such as LEED, AES and (high resolution) STM.

By modifying the growing conditions, the volume of the pores, the average coverage and the level of crystallinity and amorphousness, respectively, can be controlled as mentioned above. Due to its self-saturated structure, the formed silica bilayer film has no measurable covalent bonds to the Ru(0001) substrate. Attractive forces are mainly based on van-der-Waals forces.

The growth substrate may, for example, have a diameter of more than 5 mm, which is useful for formation of the silica bilayer film in an economic manner. The inventors assume that the size of the growth substrate is not relevant for the working of the present invention.

The silica bilayer film is preferably a silica bilayer film as defined in one of the embodiments of the supported silica bilayer film described hereinbefore.

(6) In step (B), the removable polymer film is preferably formed by spin coating. For this purpose, a solution of the polymer is spin coated onto the silica bilayer film supported on the growth substrate that is obtained in step (A), followed by subsequent removal of the solvent, for example by drying. For instance, a PMMA solution in a suitable organic solvent such as acetone can be spin coated at an ambient temperature for example using 1500 to 1800 rpm. Preferably, the concentration of PMMA in the solution is in the range of 10 to 30 wt. %, more preferably 15 to 22 wt. %, for example 20 to 21 wt. %. Methods for enhancing or accelerating the solubility such as heating or ultrasonication should be avoided to ensure that no damages of the polymer chains occur. Without being bound to theory, the inventors assume that formation of the PMMA film by spin coating might improve the interactions with the silica bilayer film and, thus, enhance the lifting off of said film.

The removable polymer film is formed in step (B) with a thickness that is sufficient for safe handling of the supported silica bilayer film. Preferably, the thickness of the removable polymer film is in the range of up to 2 mm, preferably 0.05 to 1 mm, more preferable 0.1 to 0.5 mm, for example 0.3 mm. A larger thickness may cause more efforts and difficulties in removing and handling the polymer film later on. In case the removable polymer film is too thin, handling of the supported silica bilayer film may be complicated. If necessary, handling could be assisted by applying a tape on the polymer film.

In step (C), the supported silica bilayer film is simply lifted off the growth substrate, preferably at ambient temperature. As mentioned above, the exfoliation is an entirely mechanical process.

Preferably, in case the PMMA film is formed by spin-coating of a PMMA solution as described above, the material is dried for a short period of time prior to exfoliation. The total drying time may depend on the solvent and the concentration of the PMMA solution; it may be less than 8 min, preferably less than 6 min, more preferably 2 to 5 min. For example, in case a PMMA solution in acetone of the above-described concentration is used for spin-coating, the total drying time is usually 2 to 6 min, preferably 2.5 to 5 min. After this period, the film has sufficient elasticity for lifting off the silica bilayer film. If the film is too rigid, cracks may occur.

Figure 3:
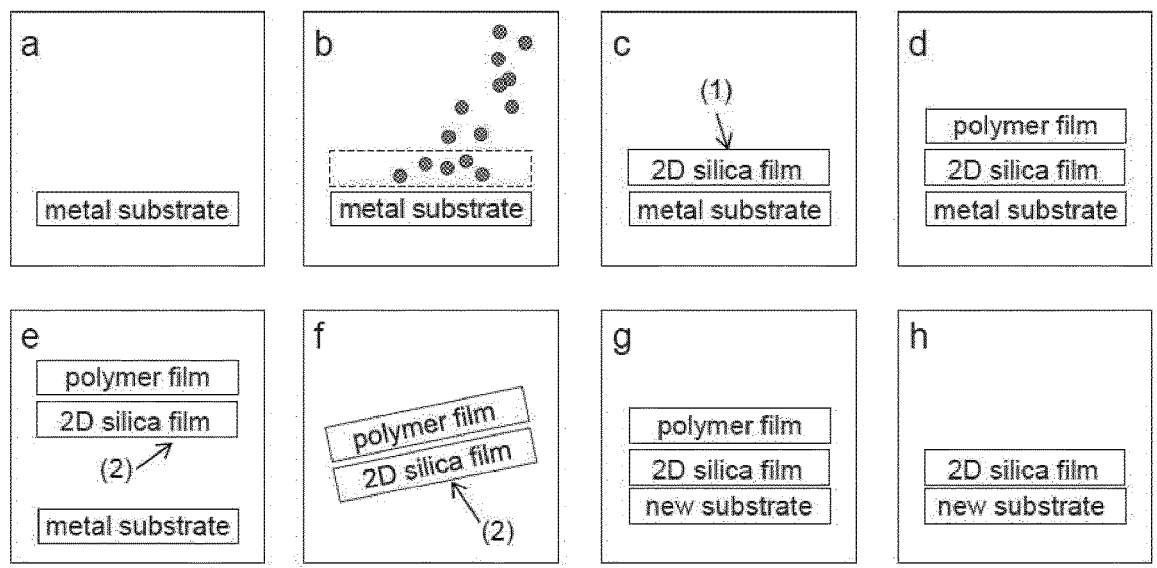
FIG. 3 illustrates a process for producing a supported silica bilayer film and a process for transferring the silica bilayer film on a new substrate.

FIG. 3 illustrates schematically the principle of the process for producing a supported silica bilayer film and the process for transferring the silica bilayer on a new substrate of choice according to an embodiment of the present invention.

In FIG. 3a, the growth substrate is shown, which is single crystal metal substrate, namely Ru(0001) according to the process of the present invention for producing a supported silica bilayer film.

FIG. 3b illustrates formation of the silica bilayer film by physical vapor deposition as in step (A) of the process for producing a supported silica bilayer film. Then, FIG. 3c shows the silica bilayer film supported by the growth substrate after completion of step (A). The silica bilayer film is atomically flat, has a chemically saturated structure and does not form covalent bonds to the metal support, i.e. the growth substrate. The attractive forces between silica bilayer film and metal substrate are mainly van-der-Waals forces.

Then, a removable polymer film based on PMMA is formed on the exposed first side (1) of the silica bilayer film. The polymer material can be applied by spin coating of a solution, preferably PMMA in acetone, as described above. After a short drying period, a polymer-coated silica bilayer film, which is still supported by the metal substrate, is obtained as illustrated in FIG. 3d. This stadium corresponds to the end of step (B) of the process for producing a supported silica bilayer film according to the present invention.

Then, the supported silica bilayer film is lifted off the growth substrate using the removable polymer film as a handle as illustrated in FIG. 3e. This step corresponds to step (C) and yields the supported silica bilayer film according to at least one of the embodiments of the present invention. Now, the second side (2) of the supported silica bilayer film is exposed, as it is free of the growth substrate used in step (A).

In optional step (D), the silica bilayer film can be transferred from the removable polymer film based on PMMA to another removable film based on a different polymer. In one preferred embodiment, step (D) comprises the following substeps:

D1) arranging the supported silica bilayer obtained in step (C) according to one of the embodiments described herein on the upper side of a substrate such that the upper side of the substrate is in contact with the exposed second side of the supported silica bilayer film while the removable PMMA film supporting the silica bilayer film is located on the first side of the silica bilayer film, which is opposite to the substrate;

D2) removing the removable PMMA film from the silica bilayer film thereby transferring the silica bilayer film to the substrate;

D3) forming a another removable polymer film on the first side of the silica bilayer film; and D4) lifting off the silica bilayer film together with the removable polymer film from the substrate.

Steps D1) and D2) correspond to steps (1) and (2) of the process for transferring the silica bilayer film to a substrate, which is described in detail below, using PMMA as removable polymer.

The substrate used in step D1) preferably exhibits small attractive forces to the silica bilayer film, for example due to a lattice mismatch. For example, Pt(111) or monocrystalline silicon may be used as substrate. The upper surface of the substrate is preferably cleaned prior to step D1), for example by using the procedures, as described herein for the cleaning of the growth substrate.

In step D2), PMMA is preferably removed under the conditions indicated below.

In step D3), the removable polymer film is formed using standard techniques such as spin coating. Suitable removable polymers are for example poly(bisphenol A carbonate) (PC), polystyrene (PS), poly(dimethyl siloxane) (PDMS) and thermal release tapes (TRT). TRT is preferably simply pressed on the silica bilayer film.

In step D4), the supported silica bilayer film is lifted off the substrate and the removable polymer film has successfully be exchanged.

Thus, step (D) provides access to a supported silica bilayer film according to one of the above embodiments, in which the removable polymer film is different from a PMMA-based film.

3 Process for Transferring the Silica Bilayer Film to a Substrate (7) A further aspect of the present invention relates to a process for transferring the silica bilayer film to a substrate. The process comprises the steps of:

(1) arranging a supported silica bilayer film according to one of the embodiments described herein on the upper side of a substrate such that the upper side of the substrate is in contact with the exposed second side of the supported silica bilayer film while the removable polymer film supporting the silica bilayer film is located on the first side of the silica bilayer film, which is opposite to the substrate; and (2) removing the removable polymer film from the silica bilayer film thereby transferring the silica bilayer film to the substrate.

With the above process, the silica bilayer film can be placed on basically every new substrate (target substrate) that tolerates the conditions for removing the removable polymer film. The new substrate may, for example, be selected from a metal, a semiconductor, a conductive material or an inorganic material depending on the desired applications of the silica bilayer film. Preferably, its surface is cleaned prior to transferring the silica bilayer film. The substrates also include supported 2D materials as described below in the context of the stack according to the present invention.

Using this process, the silica bilayer film can be transferred onto a substrate, on which the silica bilayer film is freely placed without destruction. The film can, for example, be placed on grids such as a TEM grid, so that both sides of the silica bilayer film are exposed to a fluid. The film can also be placed in a fluid (liquid).

Hence, this process can be used for obtaining a freestanding silica bilayer film, as described in more detail below.

Moreover, the process allows for introducing or installing the silica bilayer film in any device such as electronic devices, e.g. as gate oxide in MOSFET, thin film capacitors and batteries.

As explained further below, the transfer process of the invention can also be used for forming a stack containing the silica bilayer film and thus enables the numerous technical and industrial applications of the silica bilayer film.

In step (1), the second side of the supported silica bilayer film is exposed. Thus, if supported silica bilayer film is used having a covered second side, the process includes an additional step for exposing the second side prior to step (1).

According to a further embodiment, the surface of the new substrate, onto which the silica bilayer film is arranged, is wetted with solvent, preferably acetone. This may increase the adhesion of the silica bilayer film to the substrate and thus facilitate the transfer of the silica bilayer film. Usually a small amount of solvent, such as a few drops on a substrate having a diameter of about 5 to 10 mm, is sufficient.

According to a further preferred embodiment, the surface of the new substrate is flat, preferably atomically flat, which is advantageous for a successful transfer. Atomically flat surfaces can be obtained by bombardment with $Ar^+$ cations and subsequent annealing, for example in case of a new substrate made of metal or a semiconductor material. Preferably, the substrate is a single crystal material in this case. Further atomically flat materials being useful as new substrate are 2D materials, which may be used for forming a stack with the silica bilayer as described below.

As regards step (2), it is worthwhile noting that the polymer film can be removed without damaging or rolling-up the silica bilayer film.

The removable polymer film is preferably selected from PMMA-based films as explained before.

(8) The removable polymer film based on poly(methyl methacrylate) (PMMA) is preferably removed by evaporation, more preferably at a temperature in the range of 235° C. to 300° C. PMMA has the advantage that it can be removed traceless by evaporation. For this, the PMMA film is preferably heated to a temperature of 235° C. or more and 300° C. or less as mentioned above. Below a temperature of 235° C., PMMA is hardly evaporated. Above temperatures of 300° C., chemical decomposition of the PMMA can cause impurities, which may be difficult to remove later on. Complete removal of PMMA can be ascertained by optical methods, AES or by high-resolution STM. In step (2), evaporation of PMMA can be effected by heating the system, i.e. substrate, silica bilayer film together with removable polymer film, in a conventional lab oven or on a hot plate. Furthermore, evaporation of PMMA can be assisted by heating the system under vacuum.

According to a further development of the above embodiment, the system, i.e. the silica bilayer film and the new support, is heated under high (less than 1 mbar) or ultrahigh (less than $10^{-4}$ mbar, preferably less than $5 \times 10^{-6}$ mbar) vacuum for a few minutes to a temperature of more than 300° C., for example 400 to 1000° C. This helps to remove potential remainders or residues from the silica bilayer film, so that a clean (on an atomic level!) surface of the silica bilayer film is ensured.

As indicated above, the present process for transferring the silica bilayer film can be employed for exchanging the removable polymer film, that is, the "handle" or "vehicle". For instance, the process can be used for transferring the silica bilayer film from a PMMA-based film to any other (removable or non-removable) polymer film (step (D) of the process for producing the supported silica bilayer film), preferably a film selected from films based on poly(bisphenol A carbonate) (PC), polystyrene (PS), and poly(dimethyl siloxane) (PDMS) as well as thermal release tapes (TRT). The transfer of the bilayer film to an adhesive tape, for example a thermal release tapes (TRT) may for instance facilitate handling of supported silica bilayer film.

This variant may be of use if a different "handle" or "vehicle" is desired for specific applications. A different removable polymer film may be desirable, for example in case the substrate or the device in which this substrate is present only tolerates specific conditions for removing said polymer film. The removable polymer films can be removed, for example, by adding (organic) solvents or by heating or evaporating the material under atmospheric pressure (e.g. in air), under reduced pressure or under a reducing atmosphere (e.g. $H_2$/Ar mixtures).

FIGS. 3f to 3h illustrate schematically the principle of the process for transferring the silica bilayer on a new substrate of choice according to an embodiment of the present invention.

The removable polymer film serves as a handle or vehicle, as the supported silica bilayer film can be safely transported to a new substrate, i.e. a target substrate of choice (FIG. 3f). The exposed second side (2) of the silica bilayer film is then arranged on the new substrate as in step (1) of the process for transferring the silica bilayer film of the present invention (FIG. 3g). The removable polymer film is still located on the opposite first side of the silica bilayer film. The surface of the target substrate may be wetted with a solvent to improve adhesion to the silica bilayer film.

Finally, in order to complete the transfer, the polymer film is removed, thereby providing the silica bilayer film on the new substrate, as in step (2) of the process for transferring the silica bilayer film of the present invention (FIG. 3h). As mentioned above, PMMA can, for example, be evaporated at a temperature in the range of 235 to 300° C., optionally under reduced pressure, which allows for quantitative removal of the polymer material.

4 Free-Standing Silica Bilayer (9) A further aspect of the present invention relates to a free-standing silica bilayer film. The silica bilayer film consists of two atomic layers of corner-sharing $SiO_4$ tetrahedra, forms in itself a chemically saturated structure and contains pores.

Hence, the silica bilayer film is a silica bilayer film according to one of the embodiments described herein, but it is characterized by being free-standing.

The term "free-standing" is known as such in the field of 2D materials and has often been used in connection with free-standing graphene materials. A. Geim ("Graphene: Status and Prospects". Science 2009; 324 (5934): 1530-4) has defined "free-standing" as "sufficiently isolated from its environment". Alternatively, one could also use the expression "isolated silica bilayer film". These definitions also apply in the context of the present invention.

(11) Preferably, the term "free-standing" relates herein to silica bilayer film having a stable structure and fulfilling at least one of the following criteria:
(i) It has been lifted off from its growth substrate
(ii) It is self-supporting over an area of at least 1 $\mu m^2$.
(iii) It can be placed on a grid, e.g. TEM grid. Then one side is fully exposed to the surrounding fluid (gas atmosphere) while the other side is exposed to the surrounding fluid through the holes of the grid.
(iv) Both sides can be fully exposed to a liquid by suspending the bilayer film in a liquid.

Since these criteria describe the same property, i.e. "free-standing", any combination thereof or all criteria together can also be used to characterize the claimed free-standing silica bilayer film.

As regards criterion (ii), "self-supporting" means without support by a solid or a liquid. The free-standing silica bilayer film is preferably self-supporting over an area of at least 2 µm², more preferably at least 5 µm².

For criterion (iv), the liquid may for example be water or an organic solvent. Obviously, materials fulfilling criterion (i), (ii) and/or criterion (iv) are suitable for the use as a membrane.

(10) The free-standing silica bilayer film is, for example, obtainable by the process for transferring the silica bilayer film according to one embodiment of the present invention. For instance a grid, for example a TEM grid, can be used as the new substrate in that process. Hence, of the silica bilayer film can be exposed on both sides in order to satisfy the above criteria.

(12) Preferably, in case the free-standing silica bilayer film is obtained by the above process, at least 10% of the area of each side of the silica bilayer film are exposed to a fluid. More preferably, 40 to 80% of the area of each side is exposed to a fluid.

5 Stack Comprising a Plurality of Silica Bilayer Films

(13) A further aspect of the present invention relates to a stack comprising or consisting of two, three or more silica bilayer films. In the stack, each silica bilayer film consists of two atomic layers of corner-sharing $SiO_4$ tetrahedra, forms in itself a chemically saturated structure and contains pores. Hence, each silica bilayer is a silica bilayer film as described herein in one of the embodiments according to the invention. The stack can contain 2 to 30, preferably 3 to 20 and more preferably 3 to 10, silica bilayer films.

The stack may contain two, three or more silica bilayer films directly arranged on another. "Directly" means without an additional layer or material arranged in between. This embodiment of the stack is, for example, suitable for applications, in which a silica or insulating layer having a multiple of the thickness of the silica bilayer film is desired.

The stack according to the present invention is, for example, obtainable by transferring a first silica bilayer film on a target substrate of choice (i.e. the new substrate) according to an embodiment of the above process for transferring the silica bilayer film followed by repeating steps (1) and (2) of the process using the growing stack as the substrate until the desired thickness or properties of the stack are obtained.

Naturally, semiconductor industries requiring ultrathin and atomically defined silica insulators or insulating spacers are an ideal application field for the above stack, which can serve as insulator in MOSFETs, integrated circuits, or the like.

(14) According to a further embodiment, the stack is selected from
 (i) a stack consisting of two, three or more silica bilayer films which are directly arranged on top of each other, or
 (ii) a stack comprising in any order, or consisting in any order of, two, three or more silica bilayer films and at least one further two-dimensional material, wherein this material is preferably arranged in between the silica bilayer films. Such a stack could be regarded as a laminate or nanocomposite material.

The term "two-dimensional material" is very common in the art of nanomaterials and denotes very thin layers (films) of functional inorganic materials (incl. graphene) having the smallest possible number of atomic layers in the z direction (perpendicular to the extension of the film/layer in x and y direction). In the case of elements, 2D materials have only one atomic layer as in graphene. In the case of compounds, 2D materials have the minimum amount of layers needed to achieve a certain stoichiometry, for example a bilayer is the thinnest possible structure to achieve the stoichiometry $SiO_2$. Typically, they have a thickness below 2 nm.

The at least one further two-dimensional material is, in each case, preferably selected from the group consisting of graphene, boron nitride, carbon nitride, boron carbon nitride, transition metal oxide-based materials and transition metal sulfide-based materials (for example $MoS_2$, $WS_2$, layered copper oxides, layered tungsten, niobium and titanium oxides), transition metal selenides, transition metal tellurides, bismuth selenide, indium selenide and gallium telluride. Said materials are preferably conductive or semiconductive materials, so that the stack according to this embodiment may be used in capacitor or battery applications or the like.

6 Field-Effect Transistor

(15) As mentioned above, a prominent application of the silica bilayer film or a stack thereof is the use a gate oxide of a field-effect transistor. Hence, a further aspect of the present invention relates to a field-effect transistor, in particular a MOSFET (metal oxide semiconductor field effect transistor). The field-effect transistor contains a gate oxide separating a gate terminal (gate electrode) from a body (bulk) of a semiconductor material, wherein
 the gate oxide comprises
  (i) a silica bilayer film, wherein the silica bilayer film consists of two atomic layers of corner-sharing $SiO_4$ tetrahedra, forms in itself a chemically saturated structure and contains pores; or
  (ii) a stack according to one of the embodiments described herein, preferably a stack consisting of silica bilayer films.

In the stack, the silica bilayer film is a silica bilayer film as described herein in of the embodiments according to the present invention.

As mentioned above, the silica bilayer film or a stack thereof is a true wide band gap insulator and thus serves as a veritable gate oxide. The thickness of the gate oxide can be defined on an atomic level by using one, two or more of the silica bilayer films resulting in a multiple of the thickness of said silica bilayer film. Thus, an atomically-flat, ultrathin and atomically defined gate oxide can be obtained. This is a new class of gate oxides and allows for producing smaller, improved field-effect transistors.

In general, a field-effect transistor (FET) is a transistor that uses an electric field to control the shape and hence the electrical conductivity of a channel of one type of charge carrier in a semiconductor material. FETs are also known as unipolar transistors as they involve single-carrier-type operation. The conductivity of the FET is regulated by a voltage applied to the gate which is insulated from the device. The applied gate voltage imposes an electric field into the device, which in turn attracts or repels charge carriers to or from the region between a source terminal and a drain terminal. Most FETs have a fourth terminal called the body (or base, bulk or substrate). This fourth terminal serves to bias the transistor into operation.

Thus, in addition to the gate terminal, the FET of the present invention includes a source terminal (source electrode), a drain terminal (drain electrode) and optionally a body terminal (body electrode).

The names of the terminals (electrodes) refer to their functions. The gate terminal may be thought of as controlling the opening and closing of a physical gate. This gate permits charge carriers to flow through or blocks their passage by creating or eliminating a channel between the source and drain. Charge-carrier flow from the source terminal towards the drain terminal is influenced by an applied voltage. The body simply refers to the bulk of the semiconductor, in which the gate, source and drain lie. Usually the body terminal is connected to the highest or lowest voltage within the circuit, depending on the type of the FET. The body terminal and the source terminal are sometimes connected together, since the source is often connected to the highest or lowest voltage within the circuit, although there are several uses of FETs which do not have such a configuration, such as transmission gates and cascode circuits.

In a MOSFET, the gate terminal is insulated from the semiconductor body by a gate oxide. In the FET (or MOSFET) of the present invention, the insulator is a gate oxide as described above.

Since the skilled person knows how to produce the other elements of a field-effect transistor, there is no need to discuss these steps herein.

7 Use of a Silica Bilayer Film

The supported silica bilayer film, the process for producing said supported silica bilayer film and the process for transferring the silica bilayer film allow for installing or introducing one, two or more silica bilayer films onto various target substrates. Hence, various applications of the silica bilayer film or a stack according to the present invention can be realized.

Specifically, its dielectric properties complement conductive materials such as graphene in heterostructure architectures (A. C. Ferrari et al., *Nanoscale* 2015, 7, 4598; M. Osada et al., *Adv. Mater.* 2012, 24, 210), as was recently shown for a 3.5 ML silica film (R. Larciprete et al., *Nanoscale* 2015, 7, 12650). The commonly observed drawback of reduced carrier mobility of graphene supported on amorphous $SiO_2$ (A. N. Rudenko et al., *Phys. Rev. B-Condens. Matter Mater. Phys.* 2011, 84, 1; M. Ishigami et al., *Nano Lett.* 2007, 7, 1643) can be circumvented by using the silica bilayer film of the invention. This way, it can be used as dielectric spacer in ever-smaller transistors (D. A. Muller et al., *Nature* 1999, 399, 758). The amorphous domains of the silica bilayer act as atomic and molecular sieves, enabling gas separation and membrane-type applications (C. Büchner et al., *J. Phys. Chem. C* 2014, 118, 20959; E. Emmez et al., *J. Phys. Chem. C* 2014, 118, 29034; P. Schlexer et al., *J. Phys. Chem. C* 2014, 118, 15884; P. Schlexer et al., *Surf. Sci.* 2016, 648, 2).

Currently, the semiconductor industry makes use of high-k dielectrics in order to minimize the thickness of the $SiO_2$ dielectric. This material class has higher dielectric constants than $SiO_2$, but it has two major drawbacks. The materials used currently are mainly hafnium silicate, hafnium dioxide, zirconium silicate and zirconium dioxide. The incorporation of these materials into the existing silicon industry is more complicated from a manufacturing standpoint. Also, the raw materials for high-k compounds are significantly more expensive. In this respect, the supported silica bilayer films provided by the present invention represent a very attractive technological alternative.

(16) Accordingly, as a further aspect, the present invention relates to the use of a silica bilayer film obtainable by a process for transferring a silica bilayer, a free-standing silica bilayer film or a stack according to one of the embodiments described above as
- a passivating layer, in particular for corrosion protection, fouling protection, solvent protection or as separation layer;
- a membrane, in particular for filtration applications, desalination applications, gas separation, atomic and molecular storage capacities such as atomic or molecular sieves (as the silica bilayer film can be formed in way that it contains pores);
- an electrically insulating layer, in particular for thin layer electronic devices, e.g. as gate oxide, multilayer components, thin film capacitors and batteries.

The present invention is further explained by figures and exemplary embodiments, which are not intended to limit the scope of the invention as defined in the claims.

EXAMPLES

Analytical Methods

1) LEED, AES, ESEM, STM

The characterization of the freshly-prepared films as well as the transferred films with LEED, AES and STM was performed in the same UHV setup. The characterization of the transferred films with ESEM was performed in a separate UHV setup. The first chamber is equipped with LEED and AES optics (both performed with a 4-grid optics ErLEED by SPECS™) and a low-temperature STM. LEED provides information on symmetry/order on the investigated surface, while AES is element-sensitive. Both techniques probe the sample surface in the µm range.

STM shows the sample morphology in real space and can achieve sub-nanometer lateral resolution. Technical details of the microscope sensor are provided in (M. Heyde et al., *Appl. Phys. Lett.* 2006, 89, 263107). Suitable conditions for analyzing the silica bilayer film by STM are described in L. Lichtenstein et al., *Phys. Rev. Lett.* 2012, 109, 106101 (incorporated by reference). STM imaging was performed in a low-temperature environment (5 K) in order to improve the stability of the sensor. For image smoothing and analysis, WSxM software was used (I. Horcas et al., *Rev. Sci. Instrum.* 2007, 78, 013705). Combined, all three techniques provide comprehensive information on the sample.

After transferring the silica bilayer to Pt(111) and subsequent characterization using LEED, AES and low-temperature STM, the sample was also investigated with a FEI Quanta 200 environmental scanning electron microscopy (ESEM). This microscope is equipped with a home built heating stage and a gas-feeding system for imaging under controlled atmosphere at pressures of up to 20 mbar. In order to avoid electron beam induced contamination of the sample surface during the imaging process, the sample was heated to around 300° C., while an oxygen atmosphere of 0.2 mbar was provided to sustain a subsurface oxygen layer. In the ESEM, the sample can be flexibly observed over a large range of magnifications, revealing structural information from mm to µm scale, and thus a better overview of sample coverage. For details regarding ESEM measurements, see Z. Wang et al., *ACS nano* 2015, 9, 1506.

2) Determination of Porosity (% Pore Volume)

Figure 7:
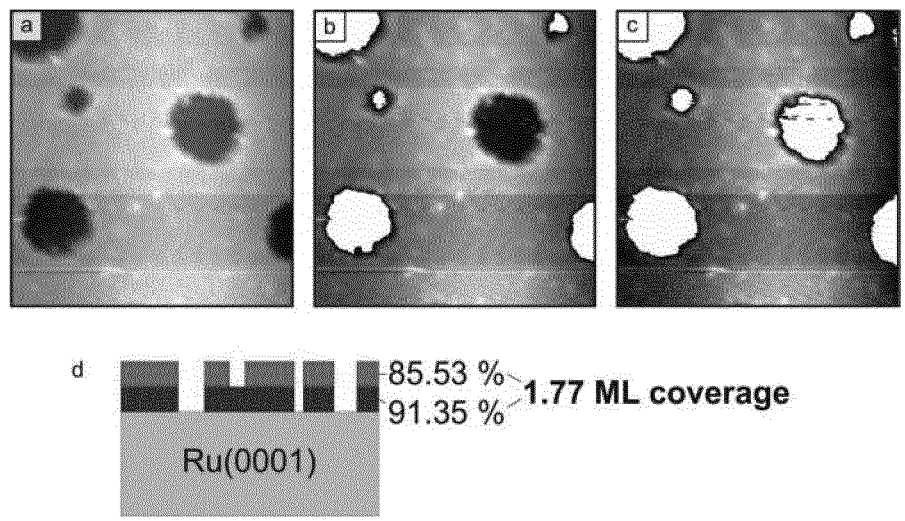
FIG. 7 shows an STM image of the silica bilayer film obtained in Example 3 and illustrates the measurement of coverage and of porosity.

For the determination of porosity (% pore volume), an appropriate number of STM images should be evaluated in the manner explained in the present application, in particular in connection with FIG. 7. For analysis of the STM images, WSxM software is used as mentioned above. The images should be taken from randomly selected, different, non-overlapping areas of the silica bilayer, each image having the same size and a preferred minimum size of 50 nm×50 nm. The combined area of the evaluated images should be at least 20,000 $nm^2$. At least 5 different images, preferably at least 10 different images, should be taken. After determining for each analyzed image the porosity the average porosity is calculated. The number of images and the combined area thereof is selected such that the target standard deviation of the determined porosity values is ±6.0 vol. % or smaller preferably ±4.0 vol. % or smaller. Note, if the calculated average porosity is in the range of 15.0 to 10.0 vol. %, the number of images and the combined area thereof is selected such that the target standard deviation is ±4.0 vol. % or smaller, preferably ±3.0 vol. % or smaller. If the calculated average porosity is less than 10.0 vol. %, the target standard deviation is ±2.5 vol. % or smaller, preferably ±1.5 vol. % or smaller. The average coverage was calculated from the calculated average porosity.

It should be noted that, for practical reasons, some of the following examples deviate from this procedure which may lead to a standard deviation of more than the above target values.

When conducting the measurement, the surface topology of the growth substrate should be taken into consideration as follows.

(i) A growth substrate can show minor differences in height, so-called terraces with a height difference of 10 nm or less. Preferably, the images are selected from atomically flat areas where the film has been deposited on the same terrace.

(ii) When determining the porosity, areas in which the film has been deposited on sections of the growth substrate with surface defects are not considered.

Sections of the growth substrate with surface defects are easily recognized by the person skilled in the art. They are typically at least 100 nm in diameter and differ in height by at least 100 nm from adjacent atomically flat areas. Sections showing substrate defects usually account for 5% or smaller of the total area of a sample. In general, a fresh growth substrate shows less surface defects than a used growth substrate, when both substrates are cleaned in the same manner.

3) Determination of Degree of Crystallinity

The degree of crystallinity is determined from high resolution STM images. To this end, an appropriate number of STM images should be evaluated in the manner explained in the present application, in particular in connection with FIG. 2. The images should be taken from randomly selected, different, non-overlapping areas of the silica bilayer, each image having the same size and a preferred minimum size of 20 nm×20 nm. The combined area of the evaluated images should be at least 10,000 nm². After determining for each analyzed image the degree of crystallinity (in %) the average crystallinity is calculated. The number of images and the combined area thereof is selected such that the standard deviation of the determined crystallinity values is smaller than 5% relative to the calculated average crystallinity.

As explained before, sections of the growth substrate with surface defects are not considered.

Example 1—Exfoliation of Silica Bilayer Film with 1.65 ML

Prior to film preparation, a round slab Ru(0001) growth substrate having a diameter of 9.2 mm was cleaned by cycles of $Ar^+$ bombardment and annealing at 1300° C. The cleanness of the metal surface was controlled using low-energy electron diffraction (LEED), AES and STM. The growth substrate was pre-covered with oxygen ($2\times10^{-6}$ mbar) at 990° C. to form a (2×2)-3O pre-covered Ru(0001) surface for 10 minutes. The sample was allowed to cool down in the same oxygen pressure to below 200° C. Then, Si was deposited on the Ru(0001) in an $O_2$ atmosphere of $2\times10^{-7}$ mbar at a temperature of 100° C. via physical vapor deposition. To this end, a commercial electron beam evaporator was loaded with a pure silicon rod. Deposition parameters and time were calibrated and modified according to the desired coverage. Afterwards, the sample was annealed to 980° C. in $2\times10^{-6}$ mbar $O_2$ for 20 minutes. The sample was cooled at a rate of 400° C./min.

A predominantly amorphous silica bilayer film containing pores was obtained on the Ru(0001) substrate. 9 STM images of 50×50 nm were analyzed in order to determine the average porosity and thereby the coverage in ML (herein "ML" stands for monolayers). According to this analysis, the film had an average coverage of 1.65±0.10 monolayers (17.5 vol. %±5.0 vol. % pores). LEED, STM and AES spectra of the silica bilayer film are shown in FIG. 4c, e and g and explained below.

A solution of 20.7 wt. % PMMA (product name "Polymethylmethacrylat Formmasse 7N" Rohm GmbH, Darmstadt, Germany, now marketed by Evonik Industries AG as "PLEXIGLAS® 7N") in acetone was formed without using enhancing methods such as heat or ultrasound, which could cause damages to the polymer chains. The Ru(0001) single crystal having the amorphous silica bilayer film formed thereon was mounted on a spin coater. 40 drops (approx. 0.5 ml) of the PMMA solution were applied at a speed of 1650 rpm within 1 minute by spin coating at ambient temperature. Spinning was continued for 1 minute. The PMMA film had a thickness of 0.3 mm. After a short drying time of in total 3.5 min, the PMMA films supporting the silica bilayer was mechanically lifted off the growth substrate. Thus, a PMMA supported silica bilayer film was obtained, which is free of the growth substrate and has an exposed side.

This supported silica bilayer can now be transferred onto a new substrate using the PMMA film as a vehicle or directly used for forming a free-standing silica bilayer film by evaporation of PMMA.

Figure 4:
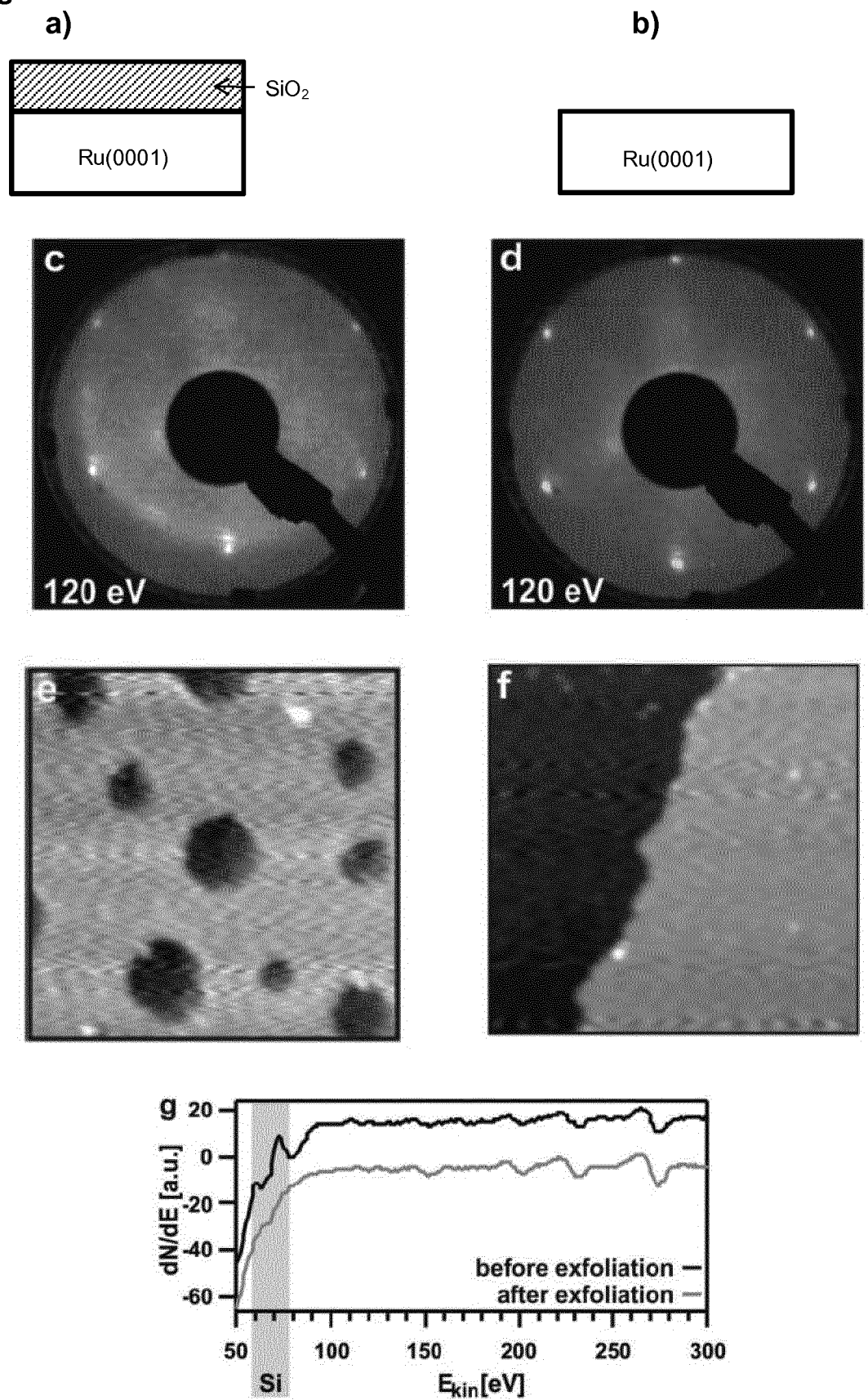
FIG. 4 shows images documenting mechanical exfoliation of a silica bilayer film from a Ru(0001) single crystal.

FIG. 4 documents the quantitative mechanical exfoliation of a silica bilayer film using a removable PMMA film according to Example 1. Images relating to the silica bilayer film on the Ru(0001) substrate are on the left hand side (FIGS. 4a, 4c and 4e). Images of the Ru(0001) substrate after mechanical exfoliation are in FIG. 4 on the right hand side (FIGS. 4b, 4d and 4f).

FIG. 4a is a schematic cross-sectional view of the silica bilayer film supported on the Ru(0001) substrate. Accordingly, FIG. 4b illustrates a schematic cross-sectional view of Ru(0001) substrate after lifting-off the silica bilayer film.

FIG. 4c is a LEED (Low-Energy Electron Diffraction) pattern of the silica bilayer film supported on Ru(0001) measured at 120 eV. It shows hexagonal reflexes of Ru and a ring feature caused by the silica bilayer film. In the corresponding LEED pattern of the plain Ru(0001) substrate after exfoliation, the reflexes relating to the silica bilayer film do not appear (see FIG. 4d).

FIG. 4e is a STM image (50 nm×50 nm, $V_S$=1 V, $I_T$=50 pA) of the silica bilayer film on Ru(0001). As shown in FIG. 4e, the silica bilayer film was grown atomically flat on the growth substrate. Pores of different sizes are clearly recognizable; the silica bilayer film as an average coverage of 1.65±0.10 monolayers. This corresponds to a volume of the pores of 17.5 vol. %±5.0 vol. % pores as described above. After mechanical exfoliation of the silica bilayer film, only bare terraces of the Ru(0001) substrate are visible in the STM image (50 nm×50 nm, $V_S$=2 V, $I_T$=50 pA) (see FIG. 4f).

Finally, in FIG. 4g, Auger electron spectroscopy (AES) measurements are shown for the silica bilayer film on Ru(0001) before exfoliation (upper curve in FIG. 4g) and the plain Ru(0001) after exfoliation (lower curve in FIG. 4g). In the AES, the silica bilayer film produces peaks at 63 and 79 eV, which are not present anymore after exfoliation.

FIGS. 4c to 4g confirm that the silica bilayer film has been quantitatively lifted-off the Ru(0001) growth substrate in one piece.

Example 2—Transfer of Silica Bilayer Film to Pt Substrate

Under ultrahigh vacuum (UHV), the surface of a Pt(111) single crystal (round slab having a diameter of 9.2 mm) was cleaned and a layer of oxygen was adsorbed on the crystal as outlined in Example 1 for the growth substrate. The Pt(111) surface was pre-covered for 5 minutes with oxygen ($2\times10^{-6}$ mbar) at 830° C. to form a (2×2)-3O pre-covered Pt(111) surface. The sample was allowed to cool down in the same oxygen pressure to ambient temperature. The surface of the Pt(111) substrate was wetted with a few drops of acetone and the exposed side of the silica bilayer film supported on PMMA produced in Example 1 was placed on the wetted Pt surface. The sample was placed on a heating plate at 300° C. for three hours at atmospheric pressure in order to evaporate PMMA. Thus, transfer of the silica bilayer film onto the new substrate Pt(111) was completed.

Note, for STM analysis, the sample was heated at 860° C. for 5 min under ultrahigh vacuum in an oxygen atmosphere ($2\times10^{-6}$ mbar) to remove potential surface adsorbates. Images of the transferred silica bilayer film on the new Pt substrate are shown in FIG. 5e, f and g as well as in FIG. 6a-d.

The structure was preserved in the transferred silica bilayer film, even in the sections around the pores. In total 17 STM images of 20 nm×20 nm and 50 nm×50 nm, respectively, which covered a total area of approx. 20,000 nm$^2$, were analyzed. According to this analysis, the amorphous silica bilayer film had 19.5 vol. %±6.5 vol. % pores, i.e. an average coverage of 1.61±0.13 monolayers.

The standard deviation was hence slightly above 6.0 vol. %. The fact that the STM images did not reveal any surface defects and the comparison of porosity values before exfoliation and after transfer of the film hence confirmed successful and quantitative transfer of the silica bilayer film.

Figure 5:
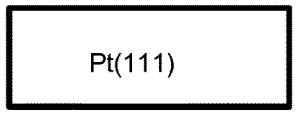
FIG. 5 shows images documenting the transfer of a silica bilayer film on a Pt(111) single crystal.
Figure 5:
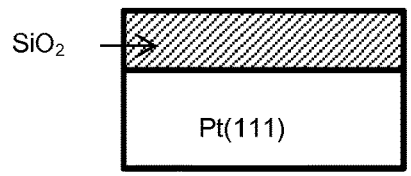
Figure 5:
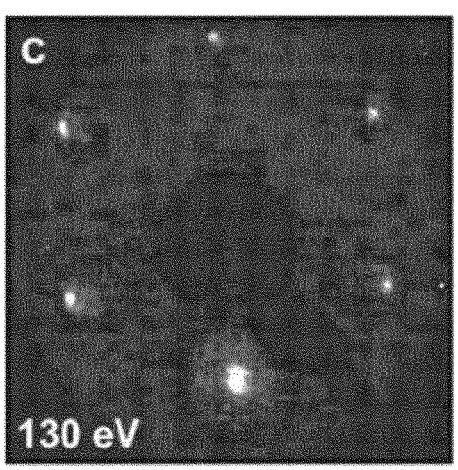
Figure 5:
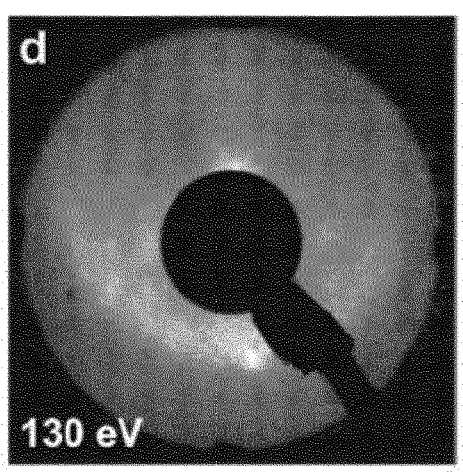
Figure 5:
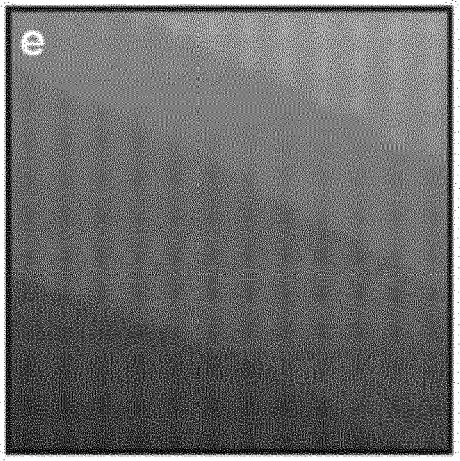
Figure 5:
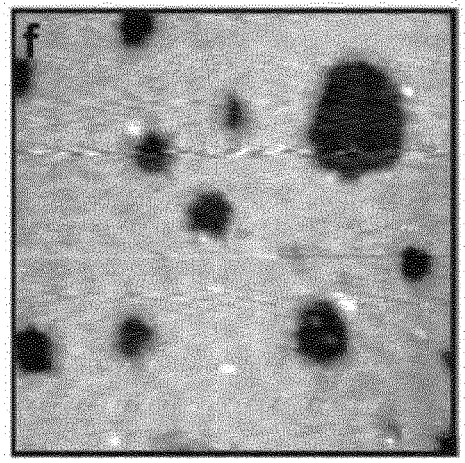
Figure 5:
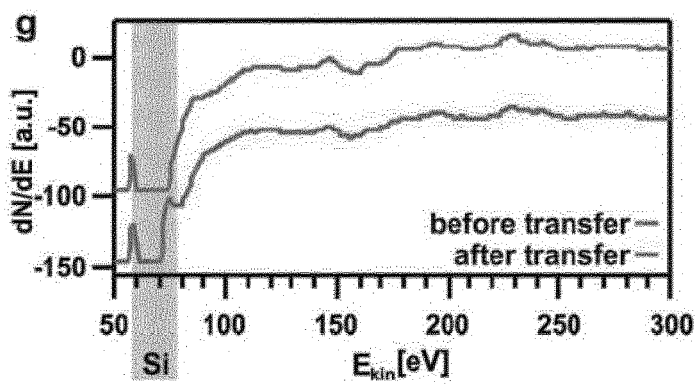

FIG. 5 documents the quantitative transfer of the silica bilayer film on a Pt(111) single crystal as the new substrate by removing the polymer film based on PMMA according to Example 2 described below. Images relating to the plain Pt(111) substrate are on the left hand side of FIG. 5 (FIGS. 5a, 5c and 5e). Images relating to the transferred silica bilayer on Pt(111) after evaporation of the PMMA are shown in FIG. 5 on the right (FIGS. 5b, 5d and 5f).

FIGS. 5a and 5b show a schematic cross-sectional view of the plain target substrate Pt(111) and the silica bilayer film on the target substrate after successful transfer, respectively.

Before transferring the silica bilayer film, the LEED pattern of the Pt(111) single crystal measured at 130 eV only reveals the hexagonal reflexes as expected (FIG. 5c). After applying the PMMA supported silica bilayer film on the Pt(111) substrate and evaporation of the PMMA, the ring-type reflexes caused by the silica bilayer film are observed in the LEED pattern at 130 eV (FIG. 5d).

In FIG. 5e, the STM image (50 nm×50 nm, $V_S$=0.5 V, $I_T$=50 pA) of the bare Pt(111) surface is shown. Furthermore, FIG. 5f shows the STM image (50 nm×50 nm, $V_S$=1 V, $I_T$=50 pA) of the transferred silica bilayer supported by the Pt(111) crystal. FIG. 5e confirms that the silica bilayer film has been successfully transferred while preserving its structure. Even in the sections surrounding the pores, the structure of the silica bilayer film is essentially intact after evaporation of PMMA. No traces of the PMMA film are found showing that its removal was quantitative. According to FIG. 5f, the transferred silica bilayer film lies atomically flat on its new support.

Finally, in FIG. 5g, AES spectra of the plain Pt(111) substrate (upper curve) and the silica bilayer film on Pt(111) after evaporation of PMMA (lower curve) are depicted. Before transfer, only the typical Pt features are found. After transfer, an additional peak at 78 eV is found indicating the presence of silicon. The second low energy peak at 63 eV of silicon found in FIG. 4g is concealed by a Pt substrate peak at approx. 64 eV in FIG. 5g. No peak of residual carbon (this feature would be expected at approx. 270 eV) is found in FIG. 5g, which indicates that PMMA was removed completely.

Figure 6:
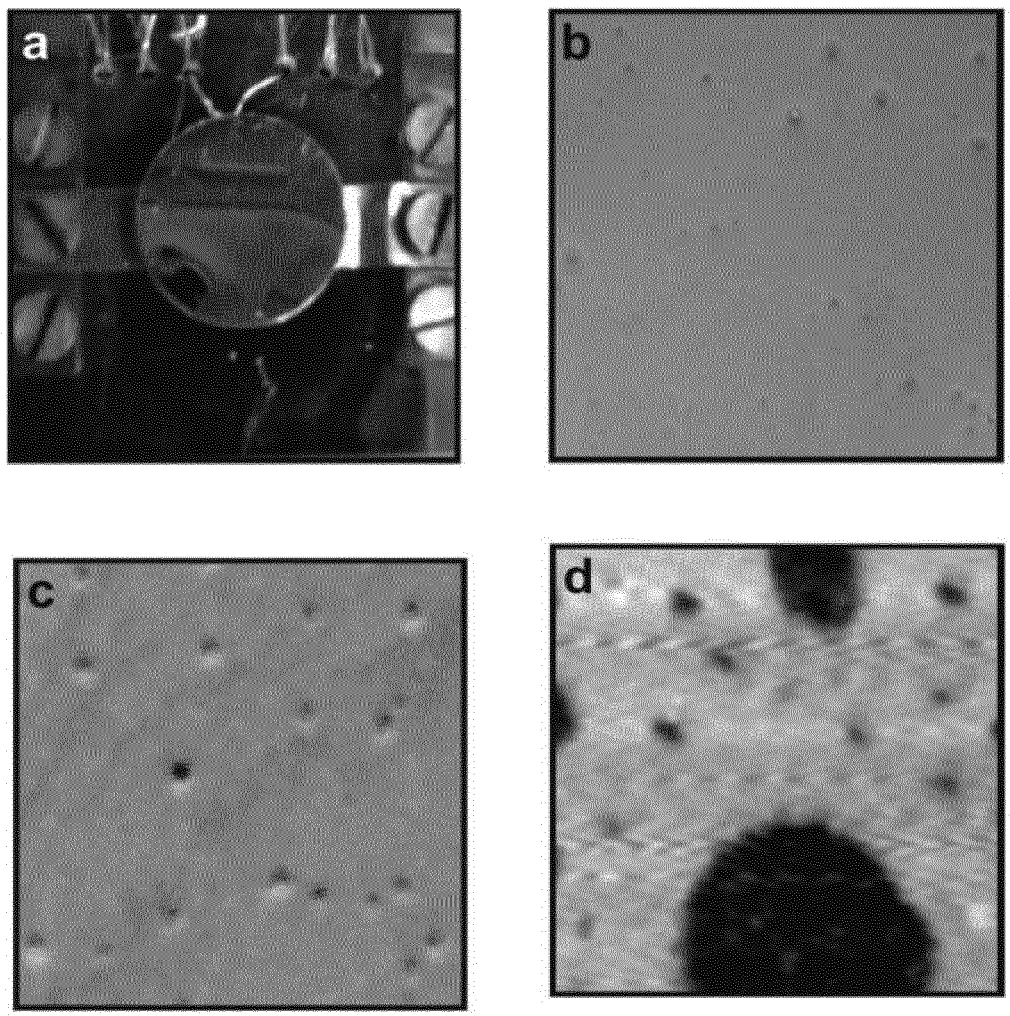
FIG. 6 shows images of silica bilayer film, which has been transferred on a Pt(111) single crystal.

FIG. 6 shows the transferred silica bilayer film on Pt(111) produced according to Example 2 at different length scales. FIG. 6a is a photo of the entire sample consisting of the round slab Pt(111) single crystal with a diameter of 9.2 mm and the transferred silica bilayer film on its surface. FIG. 6b is an ESEM image of the silica bilayer film (500 μm×500 μm, contrast inverted) and shows even coverage of the substrate with the silica bilayer film. In FIG. 6c, a further ESEM image of the silica bilayer film (500 nm×500 nm, contrast inverted) is shown. It reveals pores in the silica bilayer film having a diameter of 20 to 40 nm. Finally, a STM image (50 nm×50 nm, $V_S$=0.5 V, $I_T$=100 pA) of the silica bilayer film is shown in FIG. 6d. Now, pores having a diameter smaller than 20 nm can be seen. In all images, a lack of transfer-induced damage, for example visible wrinkles, cracks or tears, confirmed the successful transfer method and sufficient stability of the silica bilayer film.

In conclusion, the transfer onto the new target substrate Pt(111) was quantitative and successful, which provides the proof of concept.

In view of the findings, it is apparent to those who are skilled in the art that the surprisingly found quantitative processes for producing the polymer-supported silica bilayer film, transferring the silica bilayer film and removing the polymer film according to the present invention open the door for various nanotechnology applications of the silica bilayer film or a stack comprising two, three or more of said silica bilayer films.

Example 3—Production of Silica Bilayer Film with Ca. 1.77 ML

Example 1 was repeated with the sole difference that the deposition time was extended to deposit an amount of silicon which leads to a silica bilayer film of about 1.77 monolayers.

A predominantly amorphous silica bilayer film containing pores and having an average coverage of ca. 1.77 monolayers (ca. 11.5 vol. % pores) was obtained on the Ru(0001) substrate. An STM image of the resulting film is shown in FIG. 7.

As outlined above, the coverage stated for all preparations was evaluated based on microscopy as illustrated in FIG. 7. The images show a flat film with open patches (pores). The height contrast (brightness) indicates whether the pores reveal the second (lower) atomic layer or the ruthenium substrate (FIG. 7a). In the example image FIG. 7a, one larger hole reveals the second (lower) atomic layer; the other holes reveal the ruthenium substrate.

The software package WSxM 5.0 is a commonly used image evaluation tool for scanning probe microscopy. It allows measuring the area of an image at a certain height. As shown in FIG. 7b, it was determined that the second atomic layer covers ca. 91% of the surface, and the first atomic layer covers ca. 86% of the surface (FIG. 7c). This adds to an average coverage of ca. 177% or ca. 1.77 monolayers (FIG. 7d).

Example 4—Exfoliation of Silica Bilayer Film with 1.71 ML

Example 1 was repeated with the sole difference that the deposition time was extended to deposit an amount of silicon which leads to a silica bilayer film of about 1.70 monolayers. 5 STM images of a total area of 8000 nm$^2$ were analyzed in order to determine the average 14.5±1.0 vol. % (coverage of ca. 1.71±0.02 monolayers).

This silica bilayer film could be successfully exfoliated from the substrate in the same manner as explained in Example 1.

Example 5—Exfoliation of Silica Bilayer Film with 1.89 ML

Example 1 was repeated with the sole difference that the deposition time was extended to deposit an amount of silicon which leads to a silica bilayer film of about 1.89 monolayers. 3 STM images of 40 nm×40 nm or larger were analyzed in order to determine the porosity of 5.5±2.5 vol. % which corresponds to an average coverage of 1.89±0.05 monolayers.

This silica bilayer film could be successfully exfoliated from the substrate in the same manner as explained in Example 1.

Comparative Example 1—Crystalline Bilayer Film with 2.0 ML

A crystalline silica bilayer film having no pores was formed according to D. Löffler et al., Phys. Rev. Lett. 2010, 105, 146104. According to step A2), the amount of deposited Si was increased by extending the deposition time, considering a previously conducted calibration for the amount of deposited Si per minute.

A PMMA film was formed on the silica bilayer film under the conditions specified in Example 1. Attempts to lift this silica bilayer film from the growth substrate failed. The film remained firmly attached to the substrate.

Comparative Example 2—Exfoliation with Adhesive Tape

A silica bilayer film was formed on Ru (0001) in the same manner as described in Example 1.

Attempts to lift this silica bilayer film from the growth substrate with Tesafilm® kristall-klar (commercially available adhesive tape from office supplier Tesa®) failed. The film remained firmly attached to the substrate.

Comparative Examples 3 to 5—Intercalation with Different Solvents

A silica bilayer film was formed on Ru(0001) in the same manner as described in Example 1 in Comparative Examples 3 to 5.

In Comparative Example 3, after transfer of the ruthenium-supported silica bilayer to air, a few drops of acetone (approx. 0.2 ml) were distributed around the rim of the produced sample in order to intercalate the solvent between the growth substrate and the silica bilayer film. Then adhesive tape (brand name Tesafilm® kristall-klar) was used to exfoliate the surface. Subsequently the sample was transferred to vacuum. The silica bilayer film remained firmly attached to the Ru(0001), as documented by LEED and AES, so that the solvent-assisted exfoliation was unsuccessful.

In Comparative Example 4, after transfer of the ruthenium-supported silica bilayer to air, a few drops of water (approx. 0.2 ml) were distributed around the rim of the produced sample in order to intercalate the solvent between the growth substrate and the silica bilayer film. Then adhesive tape (brand name Tesafilm® kristall-klar) was used to exfoliate the surface. Subsequently the sample was transferred to vacuum. The silica bilayer film remained firmly attached to the Ru(0001), as documented by LEED and AES, so that the solvent-assisted exfoliation was unsuccessful.

In Comparative Example 5, after transfer of the ruthenium-supported silica bilayer to air, a few drops of ethanol (approx. 0.2 ml) were distributed around the rim of the produced sample in order to intercalate the solvent between the growth substrate and the silica bilayer film. Then adhesive tape (brand name Tesafilm® kristall-klar) was used to exfoliate the surface. Subsequently the sample was transferred to vacuum. The silica bilayer film remained firmly attached to the Ru(0001), as documented by LEED and AES, so that the solvent-assisted exfoliation was unsuccessful.

The invention claimed is:

1. A supported silica bilayer (SiO$_2$ bilayer) film, wherein:
    the silica bilayer film consists of two atomic layers of corner-sharing SiO$_4$ tetrahedra, forms in itself a chemically saturated structure, contains pores, and has a thickness of 0.3 to 1 nm,
    and wherein the silica bilayer film has a first (1) and a second side (2) and is supported on the first side (1) by a removable polymer film,
    and wherein the silica bilayer film is not attached to a growth substrate and the second side (2) is exposed.

2. The supported silica bilayer film according to claim 1, wherein the total volume of the pores contained in the silica bilayer film amount to 5.0 to 35.0 vol. %, based on the total volume of the silica bilayer film and the pores contained therein.

3. The supported silica bilayer film according to claim 1, wherein (i) the silica bilayer film is amorphous or (ii) consists of amorphous and crystalline domains, which crystalline domains constitute less than 50% of the silica bilayer film.

4. A process for producing a supported silica bilayer film, comprising the steps:
    (A) forming a silica bilayer film on Ru(0001) as a growth substrate by physical vapor deposition and subsequent annealing, wherein
        the silica bilayer film consists of two atomic layers of corner-sharing SiO$_4$ tetrahedra, forms in itself a chemically saturated structure, contains pores, and has a thickness of 0.3 to 1 nm,
        wherein the silica bilayer film has a first (1) and a second side (2), the second side (2) being in contact with the growth substrate;
    (B) forming a removable polymer film based on poly (methyl methacrylate) (PMMA) on the first side (1) of the silica bilayer film; and (C) lifting off the silica bilayer film together with the removable polymer film based on PMMA from the growth substrate;

(D) and optionally transferring the silica bilayer film from the removable polymer film based on PMMA to another removable film based on a different polymer.

5. The process according to claim 4, wherein the removable polymer film based on PMMA is formed by spin coating.

6. A process for transferring a silica bilayer film to a substrate, comprising the steps:
   (1) arranging the supported silica bilayer film according to claim 1 on the upper side of a substrate such that the upper side of the substrate is in contact with the exposed second side (2) of the supported silica bilayer film while the removable polymer film supporting the silica bilayer film is located on the first side (1) of the silica bilayer film, which is opposite to the substrate; and
   (2) removing the removable polymer film from the silica bilayer film thereby transferring the silica bilayer film to the substrate.

7. The process according to claim 6, wherein, in step (2), the removable polymer film is based on poly(methyl methacrylate) (PMMA) and removed by evaporation.

8. A silica bilayer film, wherein the silica bilayer film consists of two atomic layers of corner-sharing $SiO_4$ tetrahedra, forms in itself a chemically saturated structure, contains pores, and has a thickness of 0.3 to 1 nm,
   and wherein the silica bilayer film is free-standing.

9. The free-standing silica bilayer film of claim 8 transferred to a substrate by a process comprising the steps: (1) arranging the silica bilayer film consists of two atomic layers of corner-sharing $SiO_4$ tetrahedra, which forms in itself a chemically saturated structure, contains pores, and has a thickness of 0.3 to 1 nm, and wherein the silica bilayer film has a first (1) and a second side (2) and is supported on the first side (1) by a removable polymer film, and wherein the silica bilayer film is not attached to a growth substrate and the second side (2) is exposed, on the upper side of a substrate such that the upper side of the substrate is in contact with the exposed second side (2) of the supported silica bilayer film while the removable polymer film supporting the silica bilayer film is located on the first side (1) of the silica bilayer film, which is opposite to the substrate; and (2) removing the removable polymer film from the silica bilayer film thereby transferring the silica bilayer film to the substrate.

10. The free-standing silica bilayer film according to claim 8, wherein the silica bilayer film is self-supporting over an area of at least 1 µm².

11. The free-standing silica bilayer film according to claim 8, wherein at least 10% of the area on each side of the film are exposed to a fluid.

12. The process according to claim 4, wherein the another removable film is a poly(bisphenol A carbonate) (PC)-based film, a polystyrene (PS)-based film, a poly(dimethyl siloxane) (PDMS)-based film, or a thermal release tape (TRT).

13. The free-standing silica bilayer film of claim 8 transferred to a substrate by a process comprising the steps: (1) arranging the silica bilayer film consists of two atomic layers of corner-sharing $SiO_4$ tetrahedra, which forms in itself a chemically saturated structure, contains pores, and has a thickness of 0.3 to 1 nm, and wherein the silica bilayer film has a first (1) and a second side (2) and is supported on the first side (1) by a removable polymer film, and wherein the silica bilayer film is not attached to a growth substrate and the second side (2) is exposed, on the upper side of a substrate such that the upper side of the substrate is in contact with the exposed second side (2) of the supported silica bilayer film while the removable polymer film supporting the silica bilayer film is located on the first side (1) of the silica bilayer film, which is opposite to the substrate; and (2) removing the removable polymer film from the silica bilayer film thereby transferring the silica bilayer film to the substrate.

\* \* \* \* \*